(12) United States Patent
Mokhlesi

(10) Patent No.: US 9,911,488 B2
(45) Date of Patent: Mar. 6, 2018

(54) THREE DIMENSIONAL NON-VOLATILE MEMORY WITH SHORTING SOURCE LINE/BIT LINE PAIRS

(71) Applicant: SANDISK TECHNOLOGIES LLC, Plano, TX (US)

(72) Inventor: Nima Mokhlesi, Los Gatos, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/299,372

(22) Filed: Oct. 20, 2016

(65) Prior Publication Data

US 2017/0117037 A1 Apr. 27, 2017

Related U.S. Application Data

(60) Provisional application No. 62/244,942, filed on Oct. 22, 2015.

(51) Int. Cl.
| | |
|---|---|
| *G11C 16/24* | (2006.01) |
| *G11C 11/56* | (2006.01) |
| *G11C 16/04* | (2006.01) |
| *G11C 16/34* | (2006.01) |

(52) U.S. Cl.
CPC ...... *G11C 11/5628* (2013.01); *G11C 11/5642* (2013.01); *G11C 16/0466* (2013.01); *G11C 16/0483* (2013.01); *G11C 16/24* (2013.01); *G11C 16/3459* (2013.01)

(58) Field of Classification Search
CPC .. G11C 16/24; G11C 16/0483; G11C 11/5628
USPC .......................... 365/185.17, 185.25, 185.28
See application file for complete search history.

(56) References Cited

U.S. PATENT DOCUMENTS

| | | | |
|---|---|---|---|
| 4,172,004 A | 10/1979 | Alcorn | |
| 5,606,527 A | 2/1997 | Kwack | |
| 5,616,961 A | 4/1997 | Kohyama | |
| 5,945,717 A | 8/1999 | Chevallier | |
| 6,005,802 A | 12/1999 | Takeuchi et al. | |
| 6,061,270 A * | 5/2000 | Choi ...................... | G11C 16/10 365/185.02 |
| 6,172,914 B1 | 1/2001 | Haddad | |
| 6,757,196 B1 | 6/2004 | Tsao | |
| 6,873,561 B2 | 3/2005 | Ooishi | |
| 7,002,843 B2 | 2/2006 | Guterman | |
| 7,020,026 B2 | 3/2006 | Guterman | |
| 7,068,539 B2 | 6/2006 | Guterman | |
| 7,088,621 B2 | 8/2006 | Guterman | |
| 7,139,198 B2 | 11/2006 | Guterman | |

(Continued)

FOREIGN PATENT DOCUMENTS

WO    WO2008/083162    7/2008

OTHER PUBLICATIONS

Forghani-Zadeh, et al., "Current-Sensing Techniques for DC-DC Converters," The 2002 45th Midwest Symposium on Circuits and Systems, Aug. 2002.

(Continued)

*Primary Examiner* — Jay Radke
(74) *Attorney, Agent, or Firm* — Vierra Magen Marcus LLP

(57) ABSTRACT

A non-volatile storage system dedicates a subset of blocks to be used for shorting source lines to bit lines at periodic positions along the bit lines during certain memory operations.

20 Claims, 22 Drawing Sheets

(56) References Cited

U.S. PATENT DOCUMENTS

| | | | |
|---|---|---|---|
| 7,280,408 | B2 | 10/2007 | Guterman |
| 7,301,810 | B2 | 11/2007 | Chen |
| 7,349,264 | B2 | 3/2008 | Mokhlesi |
| 7,414,887 | B2 | 8/2008 | Guterman |
| 7,447,075 | B2 | 8/2008 | Guterman |
| 7,453,730 | B2 | 11/2008 | Guterman |
| 7,460,406 | B2 | 12/2008 | Mokhlesi |
| 7,514,321 | B2 | 4/2009 | Mokhlesi |
| 7,518,928 | B2 | 4/2009 | Guterman |
| 7,545,681 | B2 | 6/2009 | Li |
| 7,575,973 | B2 | 8/2009 | Mokhlesi |
| 7,616,481 | B2 | 11/2009 | Mokhlesi |
| 7,619,930 | B2 | 11/2009 | Mokhlesi |
| 7,660,162 | B2 | 2/2010 | Cho |
| 7,745,265 | B2 | 6/2010 | Mokhlesi |
| 7,808,038 | B2 | 10/2010 | Mokhlesi |
| 7,848,145 | B2 | 12/2010 | Mokhlesi |
| 7,851,851 | B2 | 12/2010 | Mokhlesi |
| 7,852,675 | B2 | 12/2010 | Maejima |
| 8,059,456 | B2 | 11/2011 | Shlick |
| 8,279,650 | B2 | 10/2012 | Yan |
| 8,509,000 | B2 | 8/2013 | Sharon |
| 9,117,549 | B1 | 8/2015 | Yoo |
| 2001/0038555 | A1* | 11/2001 | Kato ............... G11C 16/0441 365/185.17 |
| 2002/0057600 | A1* | 5/2002 | Sakui ............... G11C 16/0483 365/185.27 |
| 2005/0041515 | A1* | 2/2005 | Futatsuyama ....... G11C 16/16 365/232 |
| 2005/0106809 | A1 | 5/2005 | Shea |
| 2005/0243628 | A1* | 11/2005 | Kasai ................ G11C 16/10 365/222 |
| 2006/0279996 | A1 | 12/2006 | Yu |
| 2008/0130379 | A1 | 6/2008 | Ohsawa |
| 2009/0238002 | A1* | 9/2009 | Wong ............... G11C 16/0483 365/185.17 |
| 2010/0008126 | A1 | 1/2010 | Toda |
| 2010/0074028 | A1* | 3/2010 | Hirose ................ G11C 5/145 365/185.29 |
| 2010/0172189 | A1* | 7/2010 | Itagaki ............. G11C 16/0483 365/185.29 |
| 2011/0002172 | A1* | 1/2011 | Kito ................ G11C 16/0483 365/185.18 |
| 2011/0019480 | A1* | 1/2011 | Kito ................ H01L 27/11565 365/185.18 |
| 2011/0069552 | A1* | 3/2011 | Itagaki ............... G11C 16/26 365/185.18 |
| 2011/0199838 | A1 | 8/2011 | Terada |
| 2011/0233644 | A1 | 9/2011 | Fukuzumi |
| 2012/0020142 | A1* | 1/2012 | Yu ..................... G11C 8/10 365/148 |
| 2012/0199895 | A1 | 8/2012 | Nitta |
| 2012/0257437 | A1* | 10/2012 | Seko ............... G11C 11/5678 365/148 |
| 2012/0320698 | A1* | 12/2012 | Itagaki ................ G11C 16/16 365/218 |
| 2013/0128667 | A1* | 5/2013 | Lee .................. G11C 16/10 365/185.11 |
| 2013/0176790 | A1 | 7/2013 | Nguyen |
| 2014/0293701 | A1 | 10/2014 | Dong |
| 2015/0092479 | A1 | 4/2015 | Dong |
| 2015/0162341 | A1* | 6/2015 | Aritome .......... H01L 27/11582 257/314 |
| 2016/0049196 | A1 | 2/2016 | Choi |
| 2016/0141301 | A1 | 5/2016 | Mokhlesi |
| 2017/0117036 | A1* | 4/2017 | Al-Shamma ....... G11C 11/5628 |

OTHER PUBLICATIONS

Lee, et al., "CMOS Continuous-Time Current-Mode Filters for High-Frequency Applications," IEEE Journal of Solid-State Circuits, vol. 28, Issue: 3, Mar. 1993.

Lee, et al., "On-Chip Current Sensing Technique for CMOS Monolithic Switch-Mode Power Converters," IEEE Xplore Conference: IEEE International Symposium on Circuits and Systems, 2002, vol. 5.

Lee et al., "A Monolithic Current-mode CMOS DC-DC Converter with On-Chip Current-Sensing Technique," IEEE Journal of Solid-State Circuits, vol. 39, No. 1, pp. 3-14, Jan. 2004.

Gabai, "On-Chip Current Sensing Technique for Cmos Monolithic Switch-Mode Power Converters, Problems in Circuits Design," Jun. 2006.

Aochi, "BiCS Flash as a Future 3D Non-volatile Memory Technology for Ultra High Density Storage Devices," Center for Semiconductor Research & Development, Semiconductor Company, Toshiba Corporation, May 2009.

Kim, et al., "A stacked memory device on logic 3D technology for ultra-high-density data storage," Nanotechnology, vol. 22, No. 25, May 2011.

Nitayama, "Bit Cost Scalable (BiCS) Flash Technology for Future Ultra High Density Storage Devices," Device Process Development Center, Corporate Research & Development Center, Toshiba Corporation, VLSI Technology Systems and Applications, Apr. 2010.

PCT Invitation to Pay Additional Fees and, Where Applicable, Protest Fee, Communication Relating to the Results of the partial International Search, dated Feb. 25, 2016, PCT Patent Application PCT/US2015/057742.

PCT International Search Report dated May 3, 2016, PCT Patent Application PCT/US2015/057742.

PCT Written Opinion of the International Searching Authority dated May 3, 2016, PCT Patent Application PCT/US2015/057742.

\* cited by examiner

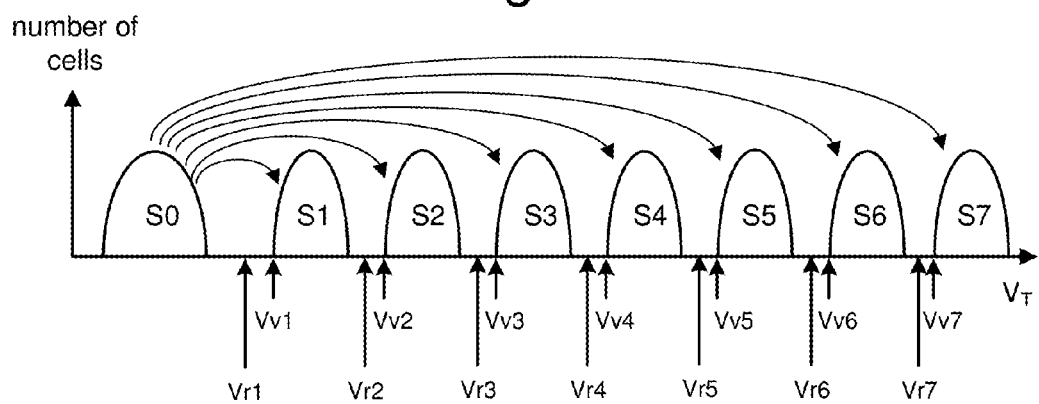
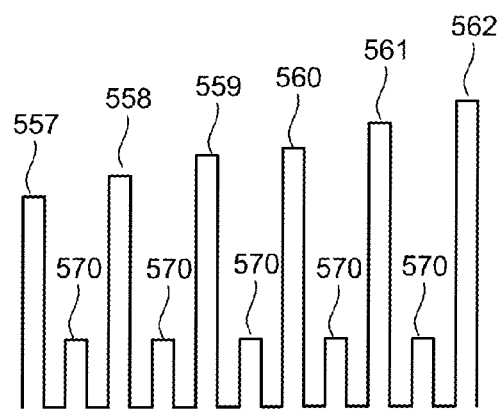

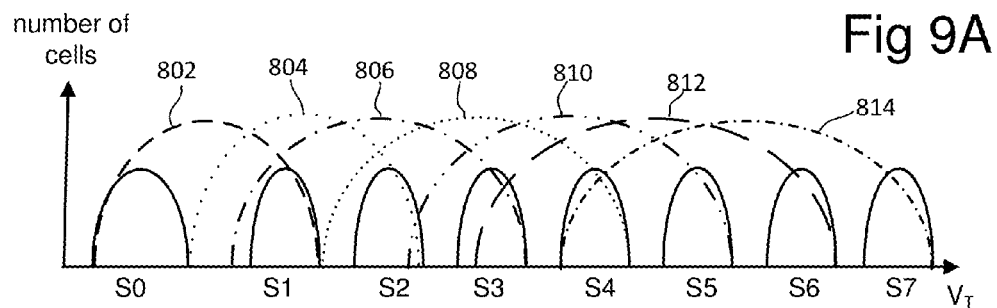
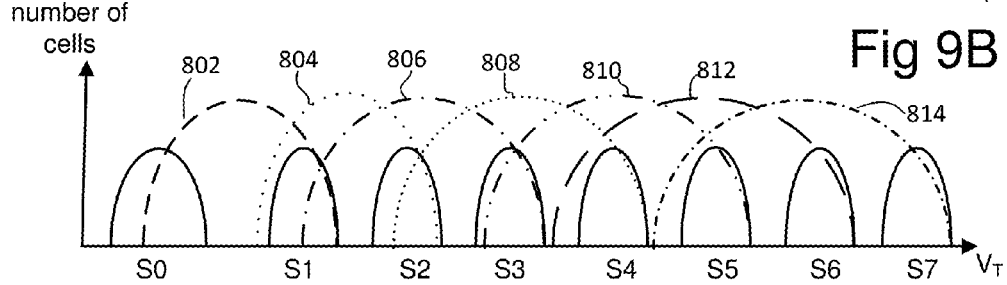
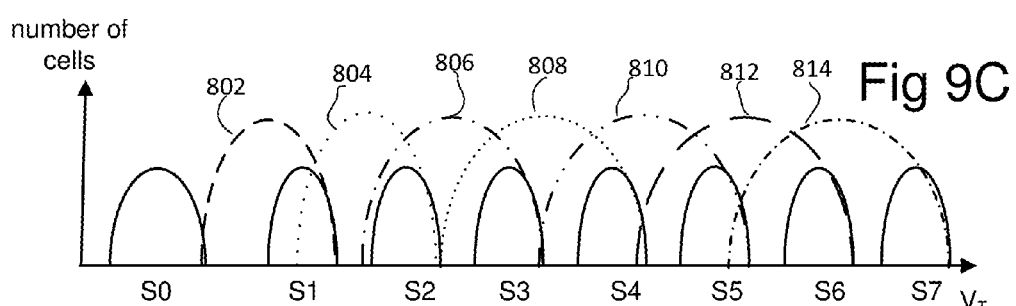
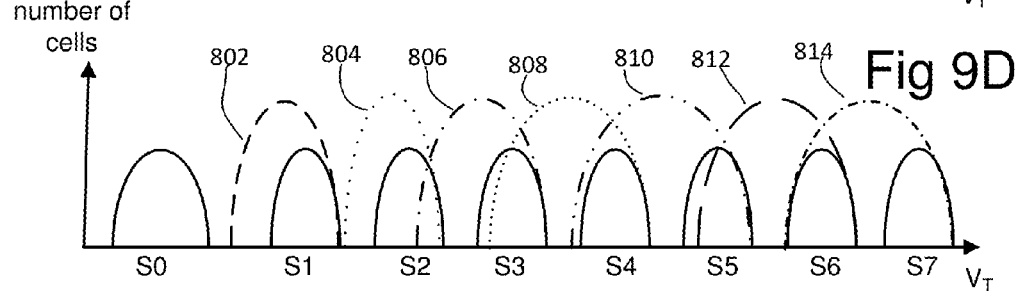
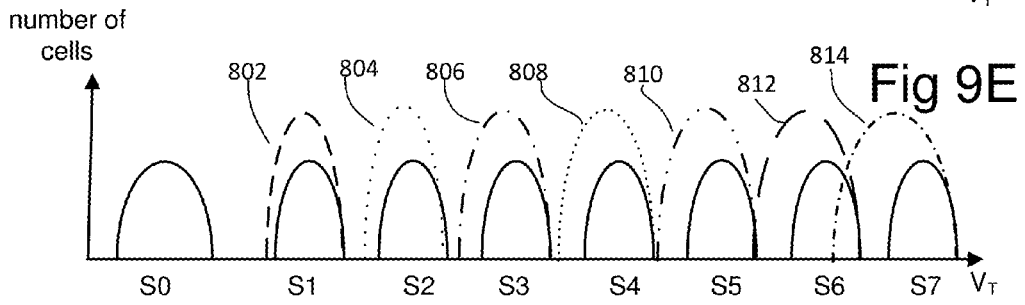

Fig 11

| State | Source Line Voltage: SL (V) | | | | Bit Line Voltage: BL (V) | | | |
|---|---|---|---|---|---|---|---|---|
| | Program | Inhibit | Verify | Lockout | Read | Program | Inhibit | Verify | Lockout | Read |
| S0 | 6.0 | 6.0 | 6.0 | 6.0 | 0.0 | 6.0 | 6.0 | 6.0 | 6.0 | 0.5 |
| S1 | 4.8 | 6.0 | 4.8 | 6.0 | 0.0 | 4.8 | 6.0 | 5.3 | 6.0 | 0.5 |
| S2 | 4.0 | 6.0 | 4.0 | 6.0 | 0.0 | 4.0 | 6.0 | 4.5 | 6.0 | 0.5 |
| S3 | 3.2 | 6.0 | 3.2 | 6.0 | 0.0 | 3.2 | 6.0 | 3.7 | 6.0 | 0.5 |
| S4 | 2.4 | 6.0 | 2.4 | 6.0 | 0.0 | 2.4 | 6.0 | 2.9 | 6.0 | 0.5 |
| S5 | 1.6 | 6.0 | 1.6 | 6.0 | 0.0 | 1.6 | 6.0 | 2.1 | 6.0 | 0.5 |
| S6 | 0.8 | 6.0 | 0.8 | 6.0 | 0.0 | 0.8 | 6.0 | 1.3 | 6.0 | 0.5 |
| S7 | 0.0 | 6.0 | 0.0 | 6.0 | 0.0 | 0.0 | 6.0 | 0.5 | 6.0 | 0.5 |

Fig 12

| Line name | Prog/Inhibit | Verify | Read |
|---|---|---|---|
| VSGD | 6V | 8V | 4V |
| WL # ≥ N+1 | 9V | 6V | 7V |
| WL N | VPGM | 5.2V | VCGR |
| WL # ≤ N−1 | 9V | 12V | 7V |
| VSGS | 6V | 8V | 4V |

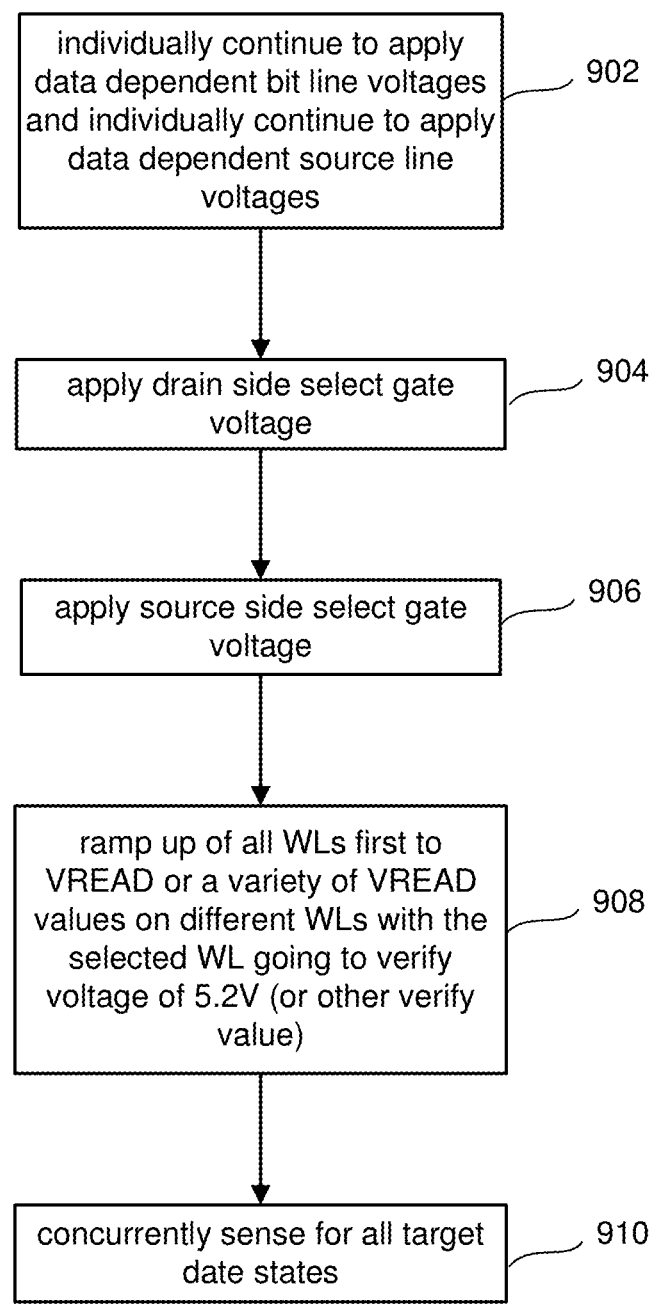

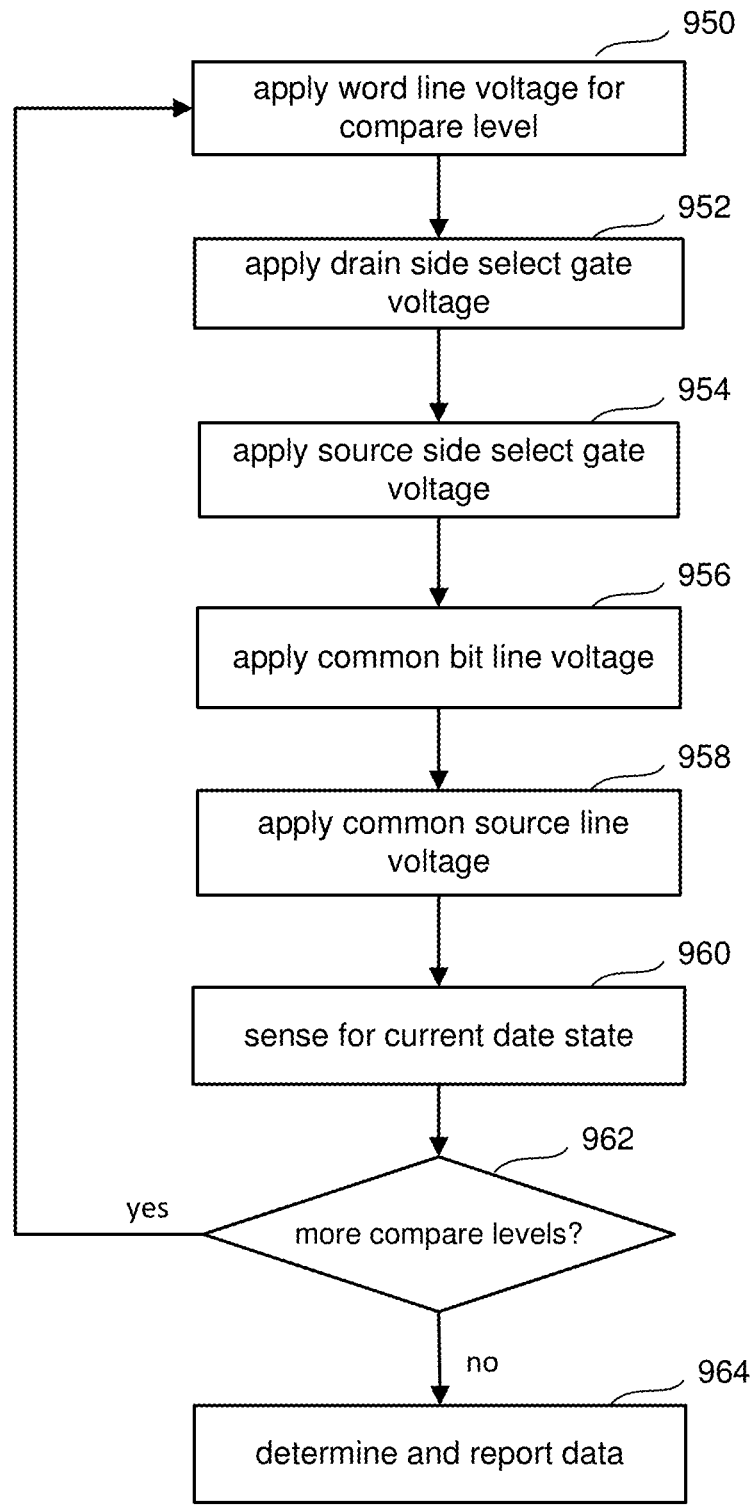

Fig. 16

| stage | 1.1 | 1.2 | 1.3 | 1.4 | 1.5 | 1.6 | 1.7 | 2.1 | 2.2 | 2.3 | 2.4 | 2.5 | 2.6 | 2.7 |
|---|---|---|---|---|---|---|---|---|---|---|---|---|---|---|
| | BL/SL chrg up to VCC | BL/SL chrg up to target | lower SGD & SGS | WLs to VPASS | WL N to VPGM #1 | transition to verify | verify # 1 | BL/SL chrg up to VCC | BL/SL chrg up to target | lower SGD & SGS | WLs to VPASS | WL N to VPGM #2 | transition to verify | verify # 2 |
| timing (µs) | ≥20 0→ | ≥20 min(x,VCC) →x | 10 | 10 | 15 | 15 | 10 | ≥20 x→x or x→VCC | ≥20 x→x or VCC→target | 10 | 10 | 15 | 15 | 10 |
| SLs | min(x,VCC) | | x | x | x | x | x | x | x | x | x | x | x | x |
| SGS0 | 0→8 | 8 | 8→6 | 6 | 6 | 6→8 | 8 | 8 | 8 | 8→6 | 6 | 6 | 6→8 | 8 |
| SGS1 | 0→8 | 8 | 8→6 | 6 | 6 | 6→8 | 8 | 8 | 8 | 8→6 | 6 | 6 | 6→8 | 8 |
| SGS2 | 0→8 | 8 | 8→6 | 6 | 6 | 6→8 | 8 | 8 | 8 | 8→6 | 6 | 6 | 6→8 | 8 |
| SGS3 | 0→8 | 8 | 8→6 | 6 | 6 | 6→8 | 8 | 8 | 8 | 8→6 | 6 | 6 | 6→8 | 8 |
| WLDS1 | 0→8 | 8 | 8→6 | 6→9 | 6 | 6→8 | 8 | 8 | 8 | 8→6 | 6→9 | 6 | 6→8 | 8 |
| WLDS2 | 0→8 | 8 | 8→6 | 6→9 | 6 | 6→8 | 8 | 8 | 8 | 8→6 | 6→9 | 6 | 6→8 | 8 |
| WL0 | 0→8 | 8 | 8 | 8→9 | 9 | 9→12 | 12 | 12→8 | 8 | 8 | 8→9 | 9 | 9→12 | 12 |
| WL < N-1 | 0→8 | 8 | 8 | 8→9 | 9 | 9→12 | 12 | 12→8 | 8 | 8 | 8→9 | 9 | 9→12 | 12 |
| WL N-1 | 0→6 | 6 | 6 | 6→9 | 9 | 9→12 | 12 | 12→6 | 6 | 6 | 6→9 | 9 | 9→12 | 12 |
| WL N | 0→3 | 3 | 3 | 3→9 | 9→VPGM | VPGM→5.2 | 5.2 | 5.2→3 | 3 | 3 | 3→9 | 9→VPGM | VPGM→5.2 | 5.2 |
| WL N+1 | 0→3 | 3 | 3 | 3→9 | 9 | 9→6 | 6 | 6→3 | 3 | 3 | 3→9 | 9 | 9→6 | 6 |
| WL > N+1 | 0→3 | 3 | 3 | 3→9 | 9 | 9→6 | 6 | 6→3 | 3 | 3 | 3→9 | 9 | 9→6 | 6 |
| WL47 | 0→3 | 3 | 3 | 3→9 | 9 | 9→6 | 6 | 6→3 | 3 | 3 | 3→9 | 9 | 9→6 | 6 |
| WLDD2 | 0→3 | 3 | 3 | 3→9 | 9 | 9→6 | 6 | 6→3 | 3 | 3 | 3→9 | 9 | 9→6 | 6 |
| WLDD1 | 0→3 | 3 | 3 | 3→9 | 9 | 9→6 | 6 | 6→3 | 3 | 3 | 3→9 | 9 | 9→6 | 6 |
| SGD3 | 0→8 | 8 | 8→6 | 6 | 6 | 6→8 | 8 | 8 | 8 | 8→6 | 6 | 6 | 6→8 | 8 |
| SGD2 | 0→8 | 8 | 8→6 | 6 | 6 | 6→8 | 8 | 8 | 8 | 8→6 | 6 | 6 | 6→8 | 8 |
| SGD1 | 0→8 | 8 | 8→6 | 6 | 6 | 6→8 | 8 | 8 | 8 | 8→6 | 6 | 6 | 6→8 | 8 |
| SGD0 | 0→8 | 8 | 8→6 | 6 | 6 | 6→8 | 8 | 8 | 8 | 8→6 | 6 | 6 | 6→8 | 8 |
| BLs | 0→ min(x,VCC) | min(x,VCC) →x | x | x | x | x | x→ x+0.5 | x+0.5→x or x+0.5→VCC | x→x or VCC→6 | x or 6 | x or 6 | x or 6 | x or 6 | x→x+0.5 or 6→6 |

Fig 18

| Electrode | S0 Prgrm | S0 Verify | S1 Prgrm | S1 Verify | S2 Prgrm | S2 Verify | S3 Prgrm | S3 Verify | S4 Prgrm | S4 Verify | S5 Prgrm | S5 Verify | S6 Prgrm | S6 Verify | S7 Prgrm | S7 Verify |
|---|---|---|---|---|---|---|---|---|---|---|---|---|---|---|---|---|
| SL: | 3.6V | 3.6V | 3.6V | 3.6V | 3.6V | 3.6V | 3.6V | 3.6V | 2.4V | 2.4V | 1.6V | 1.6V | 0.8V | 0.8V | 0.0V | 0.0V |
| 4 X SGS: | 3.6V | 6.4V | 3.6V | 6.4V | 3.6V | 6.4V | 3.6V | 6.4V | 3.6V | 6.4V | 3.6V | 6.4V | 3.6V | 6.4V | 3.6V | 6.4V |
| 2 X WLDS: | 3.6V | 5.4V | 3.6V | 5.4V | 3.6V | 5.4V | 3.6V | 5.4V | 3.6V | 5.4V | 3.6V | 5.4V | 3.6V | 5.4V | 3.6V | 5.4V |
| WL 0: | 9.0V | 9.6V | 9.0V | 9.6V | 9.0V | 9.6V | 9.0V | 9.6V | 9.0V | 9.6V | 9.0V | 9.6V | 9.0V | 9.6V | 9.0V | 9.6V |
| WL 1→N−1 | 9.0V | 9.6V | 9.0V | 9.6V | 9.0V | 9.6V | 9.0V | 9.6V | 9.0V | 9.6V | 9.0V | 9.6V | 9.0V | 9.6V | 9.0V | 9.6V |
| WL N: | VPGM | 5.2V | VPGM | 5.2V | VPGM | 5.2V | VPGM | 5.2V | VPGM | 5.2V | VPGM | 5.2V | VPGM | 5.2V | VPGM | 5.2V |
| WL N+1→46 | 6.0V | 3.6V | 6.0V | 3.6V | 6.0V | 3.6V | 6.0V | 3.6V | 6.0V | 3.6V | 6.0V | 3.6V | 6.0V | 3.6V | 6.0V | 3.6V |
| WL 47: | 6.0V | 3.6V | 6.0V | 3.6V | 6.0V | 3.6V | 6.0V | 3.6V | 6.0V | 3.6V | 6.0V | 3.6V | 6.0V | 3.6V | 6.0V | 3.6V |
| 2 X WLDD: | 3.6V | 5.4V | 3.6V | 5.4V | 3.6V | 5.4V | 3.6V | 5.4V | 3.6V | 5.4V | 3.6V | 5.4V | 3.6V | 5.4V | 3.6V | 5.4V |
| 4 X SGD: | 3.6V | 6.4V | 3.6V | 6.4V | 3.6V | 6.4V | 3.6V | 6.4V | 3.6V | 6.4V | 3.6V | 6.4V | 3.6V | 6.4V | 3.6V | 6.4V |
| BL: | 3.6V | 3.6V | 3.6V | 3.6V | 3.6V | 3.6V | 3.6V | 3.6V | 2.4V | 2.9V | 1.6V | 2.1V | 0.8V | 1.3V | 0.0V | 0.5V |

Fig 19

| Electrode | S0 Prgrm | S0 Verify | S1 Prgrm | S1 Verify | S2 Prgrm | S2 Verify | S3 Prgrm | S3 Verify | S4 Prgrm | S4 Verify | S5 Prgrm | S5 Verify | S6 Prgrm | S6 Verify | S7 Prgrm | S7 Verify |
|---|---|---|---|---|---|---|---|---|---|---|---|---|---|---|---|---|
| SL: | 2.8V | 2.8V | 1.6V | 1.6V | 0.8V | 0.8V | 0.0V | 0.0V | 2.8V | 2.8V | 2.8V | 2.8V | 2.8V | 2.8V | 2.8V | 2.8V |
| 4 X SGS: | 2.8V | 5.6V | 2.8V | 5.6V | 2.8V | 5.6V | 2.8V | 5.6V | 2.8V | 5.6V | 2.8V | 5.6V | 2.8V | 5.6V | 2.8V | 5.6V |
| 2 X WLDS: | 2.8V | 4.6V | 2.8V | 4.6V | 2.8V | 4.6V | 2.8V | 4.6V | 2.8V | 4.6V | 2.8V | 4.6V | 2.8V | 4.6V | 2.8V | 4.6V |
| WL 0: | 8.0V | 8.8V | 8.0V | 8.8V | 8.0V | 8.8V | 8.0V | 8.8V | 8.0V | 8.8V | 8.0V | 8.8V | 8.0V | 8.8V | 8.0V | 8.8V |
| WL 1→N−1 | 8.0V | 8.8V | 8.0V | 8.8V | 8.0V | 8.8V | 8.0V | 8.8V | 8.0V | 8.8V | 8.0V | 8.8V | 8.0V | 8.8V | 8.0V | 8.8V |
| WL N: | VPGM | 2.0V | VPGM | 2.0V | VPGM | 2.0V | VPGM | 2.0V | VPGM | 2.0V | VPGM | 2.0V | VPGM | 2.0V | VPGM | 2.0V |
| WL N+1→46 | 5.0V | 2.8V | 5.0V | 2.8V | 5.0V | 2.8V | 5.0V | 2.8V | 5.0V | 2.8V | 5.0V | 2.8V | 5.0V | 2.8V | 5.0V | 2.8V |
| WL 47: | 5.0V | 2.8V | 5.0V | 2.8V | 5.0V | 2.8V | 5.0V | 2.8V | 5.0V | 2.8V | 5.0V | 2.8V | 5.0V | 2.8V | 5.0V | 2.8V |
| 2 X WLDD: | 2.8V | 4.6V | 2.8V | 4.6V | 2.8V | 4.6V | 2.8V | 4.6V | 2.8V | 4.6V | 2.8V | 4.6V | 2.8V | 4.6V | 2.8V | 4.6V |
| 4 X SGD: | 2.8V | 5.6V | 2.8V | 5.6V | 2.8V | 5.6V | 2.8V | 5.6V | 2.8V | 5.6V | 2.8V | 5.6V | 2.8V | 5.6V | 2.8V | 5.6V |
| BL: | 2.8V | 2.8V | 1.6V | 2.1V | 0.8V | 1.3V | 0.0V | 0.5V | 2.8V | 2.8V | 2.8V | 2.8V | 2.8V | 2.8V | 2.8V | 2.8V |

| Line name | Programming | Verify | Read |
|---|---|---|---|
| VSGD | 4V | 0V | 0V |
| WL | 2V | 0V | 0V |
| VSGS | 4V | 0V | 0V |

Fig 22

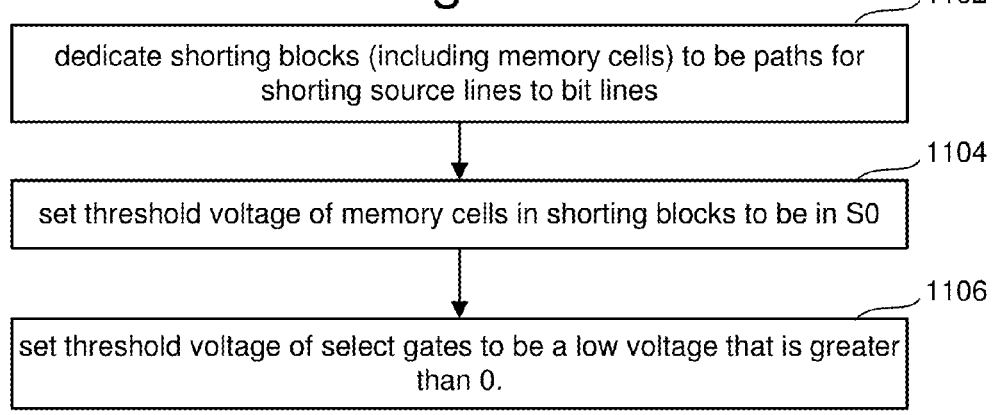

Fig. 23

1102 — dedicate shorting blocks (including memory cells) to be paths for shorting source lines to bit lines 1104 — set threshold voltage of memory cells in shorting blocks to be in S0

1106 — set threshold voltage of select gates to be a low voltage that is greater than 0.

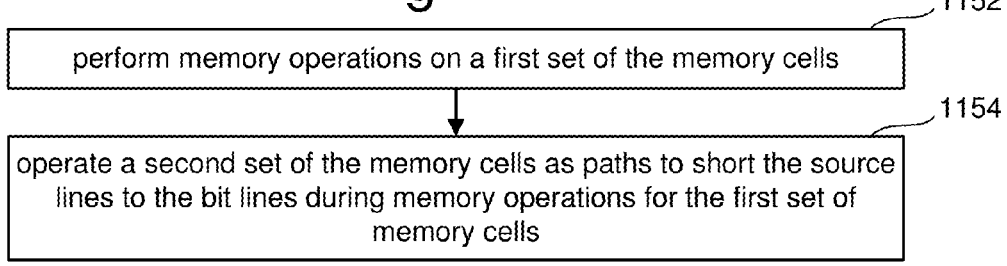

Fig. 24

1152 — perform memory operations on a first set of the memory cells

1154 — operate a second set of the memory cells as paths to short the source lines to the bit lines during memory operations for the first set of memory cells

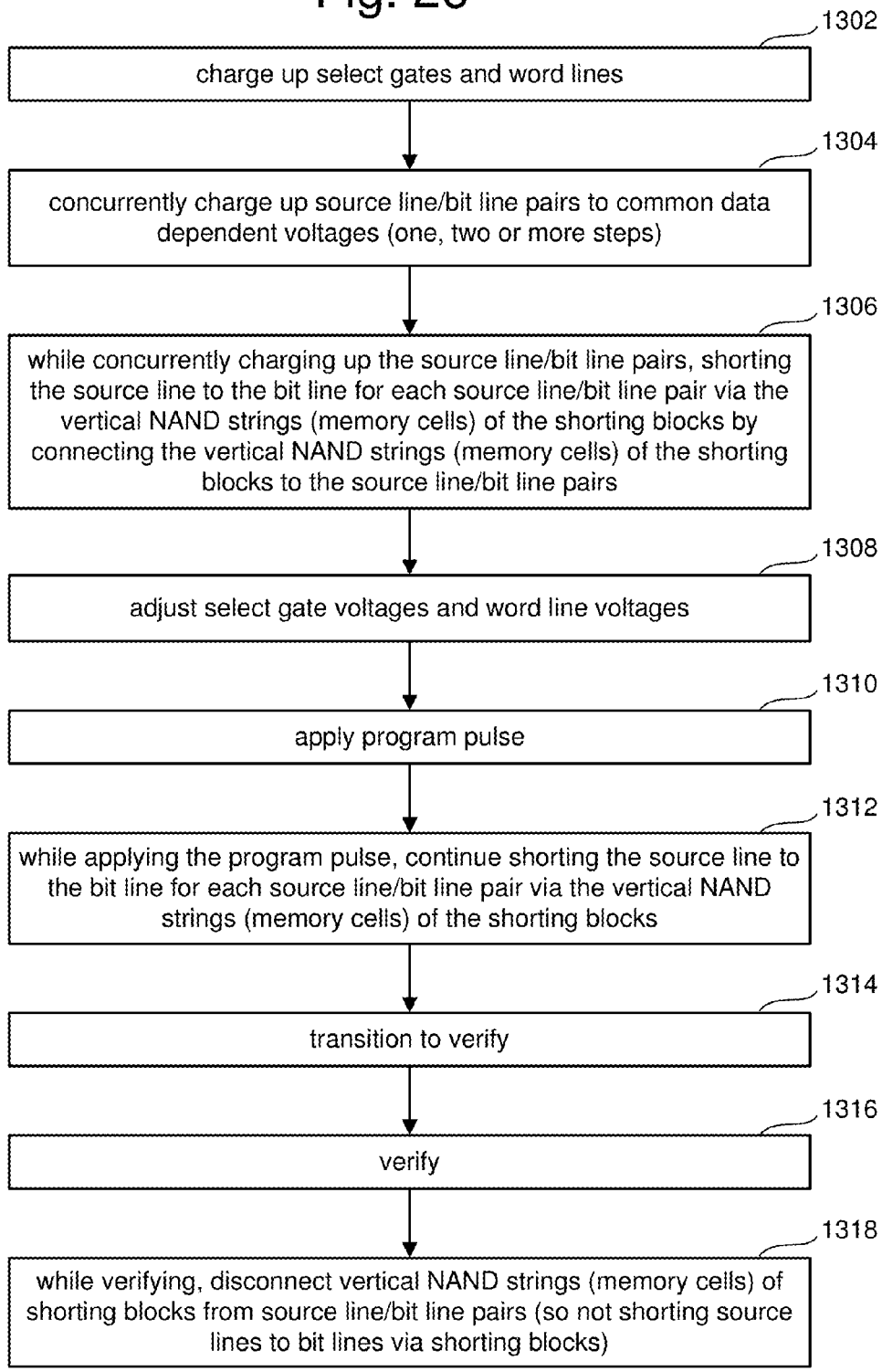

US 9,911,488 B2

THREE DIMENSIONAL NON-VOLATILE MEMORY WITH SHORTING SOURCE LINE/BIT LINE PAIRS

CLAIM OF PRIORITY

This application claims the benefit of U.S. Provisional Application 62/244,942, filed Oct. 22, 2015, incorporated herein by reference in its entirety.

BACKGROUND

Recently, ultra high density storage devices have been proposed using a three dimensional (3D) stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers. A NAND string is then formed by filling the memory hole with appropriate materials. A straight NAND string (I-BiCS) extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers. However, various challenges are presented in operating such memory devices.

BRIEF DESCRIPTION OF THE DRAWINGS

Like-numbered elements refer to common components in the different figures.

FIG. 8 depicts a set of threshold voltage distributions representing data states.

FIGS. 9A-9E depict a programming process.

FIG. 11 is a table identifying various voltages applied to the individual source lines and bit lines.

FIG. 12 is a table identifying various voltages applied to word lines and select gate lines.

FIG. 13 depicts the voltage applied to the selected word line during a programming process.

FIG. 14 is a flow chart describing one embodiment of a process for verifying.

FIG. 15 is a flow chart describing one embodiment of a process for reading.

FIG. 16 is a table of voltages used during one embodiment of programming and verification of programming.

FIG. 18 is a table of voltages used for a first pass of a multi-pass programming process that programs high states first.

FIG. 19 is a table of voltages used for a second pass of a multi-pass programming process that programs high states first.

FIG. 22 is table of voltages used by blocks of memory cells dedicated to shorting bit lines to source lines.

FIG. 23 is a flow chart describing one embodiment of a process for establishing blocks of memory cells dedicated to shorting bit lines to source lines.

FIG. 24 is a flow chart describing one embodiment of a process for operating blocks of memory cells dedicated to shorting bit lines to source lines.

FIG. 26 is a flow chart describing one embodiment of a process for operating blocks of memory cells dedicated to shorting bit lines to source lines.

DETAILED DESCRIPTION

Figure 1A:
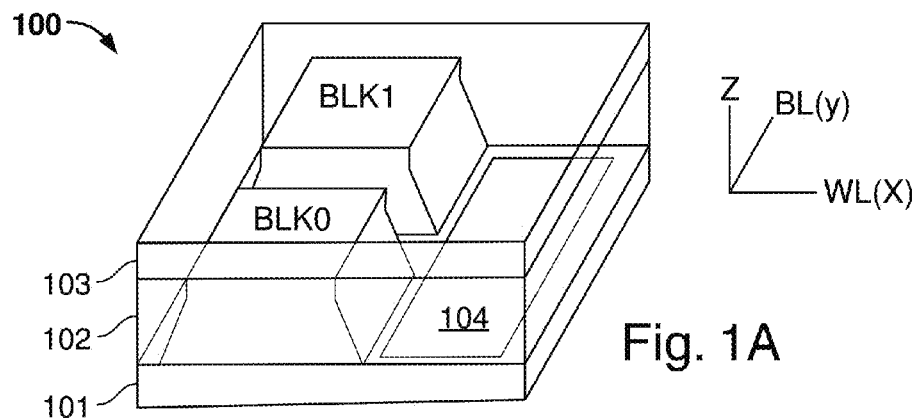
FIG. 1A is a perspective view of a portion of a 3D stacked non-volatile memory.

A three dimensional stacked non-volatile memory device comprises alternating dielectric layers and conductive layers in a stack, a plurality of bit lines below the stack, and a plurality of source lines above the stack. There is a separate source line associated with each bit line, rather than one source line for an entire block, plane or array. Each source line is connected to a different subset of NAND strings. Each bit line is connected to a different subset of NAND strings. Because the bit lines are below the stack, there is no need for signal lines to carry signals from the substrate surface to the top of the stack for the bit lines and no crowding of lines occurs as bit lines try to pass through source lines when they are both at minimum pitch. Since bit line driver circuits are bigger than source line driver circuits, one embodiment locates bit lines underneath the memory array so that the bit line drivers residing on the silicon surface under the memory array have direct access to the bit lines. In one embodiment, the source line drivers, being smaller in size, are placed on the side of the memory array. Since the source line drivers are smaller than the bit line drivers and also smaller than the traditional sense amp circuits, this arrangement shrinks the memory die size by saving the area which is traditionally reserved for sense amplifiers (the traditional bit line drivers).

The three dimensional stacked memory device comprises a plurality of memory cells arranged in blocks. Each block includes memory holes (or pillars) which extend vertically in the stack, and comprise a column of memory cells such as, for example, in a NAND string. The three dimensional stacked non-volatile memory device includes N layers. The memory holes are divided into four groups at each level of a block and each group has a separate set of source side and drain side select signals so that a subset of memory holes can be active at any given time. Because of the concurrency in the programming and verifying, the number of programming and verify pulses is reduced and the overall programming process is faster than other architectures. This is enabled because each memory channel/hole in a selected group has its own dedicated source line in addition to having its own dedicated bit line. With this architecture each memory channel can be driven to its own designated voltage at both its source line and its bit line. This provides full control of the channel potential. Each channel can have one of a number of different potentials applied to it based on what data state is to be programmed on the memory cell that is along that channel and belongs to the selected word line. A data state is a condition of the memory cell which correlates to storing a predefined pattern of data. The meaning of a data state can change based on the type of memory technology used in various embodiments. For example, in a multi-level memory cell different threshold voltage levels for the cell may correlate to a particular data pattern that represents data settings on two or more logical levels of data stored in the multi-level memory cell. In another example, the data state may comprise the level of resistance for a filament formed in the cell. In another example, the data state may comprise the magnetic orientation of a magnetic layer in a Spin-transfer torque random access memory cell (STT-RAM).

The proposed structure allows for multiple data states to be verified concurrently, as is explained below. Memory cells are concurrently programmed to different data states, with memory cells being programmed to lower data states having their programming slowed by applying appropriate source line voltages and bit line voltages. In one embodiment, reading is performed sequentially for the data states.

Each bit line is paired with a different source line to form source line/bit line pairs. During certain memory operations, it may be necessary to raise a bit line and a source line of a source line/bit line pair to a common target voltage. In some situations, one of the bit line or the source line might reach that target voltage faster than the other. Rather than wait for the other line to reach the target voltage, it is proposed to use a set of one or more blocks of memory cells (or other grouping of one or more memory cells) to create an electrical path which effectively shorts the bit line to the source line of a source line/bit line pair so that the line that reaches the target voltage first will pull up the other line faster.

FIG. 1A is a perspective view of a portion of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more metal layers lower than the bit line layer which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. While two blocks are depicted in FIG. 1A as an example, additional blocks can be used, extending in the x- and/or y-directions.

In one possible approach, the length of the plane, in the x-direction, represents a direction in which word lines extend, and the width of the plane, in the y-direction, represents a direction in which bit lines extend. The z-direction represents a height of the memory device.

Figure 1C:
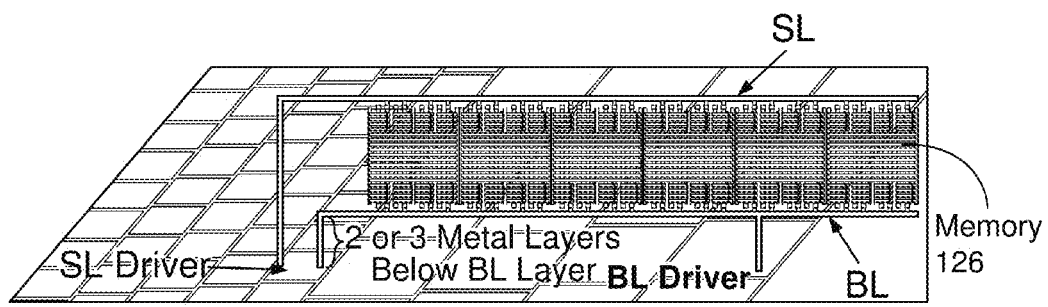
FIG. 1C and FIG. 1D show the positioning of the memory array, source line drivers and bit line drivers.
Figure 1D:
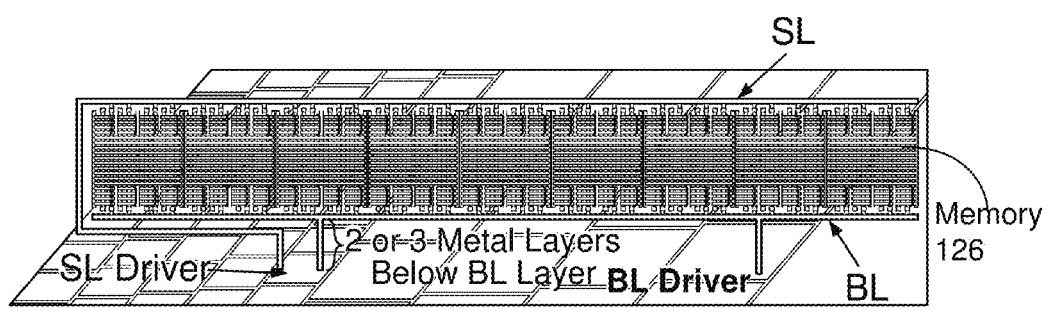
Figure 1B:
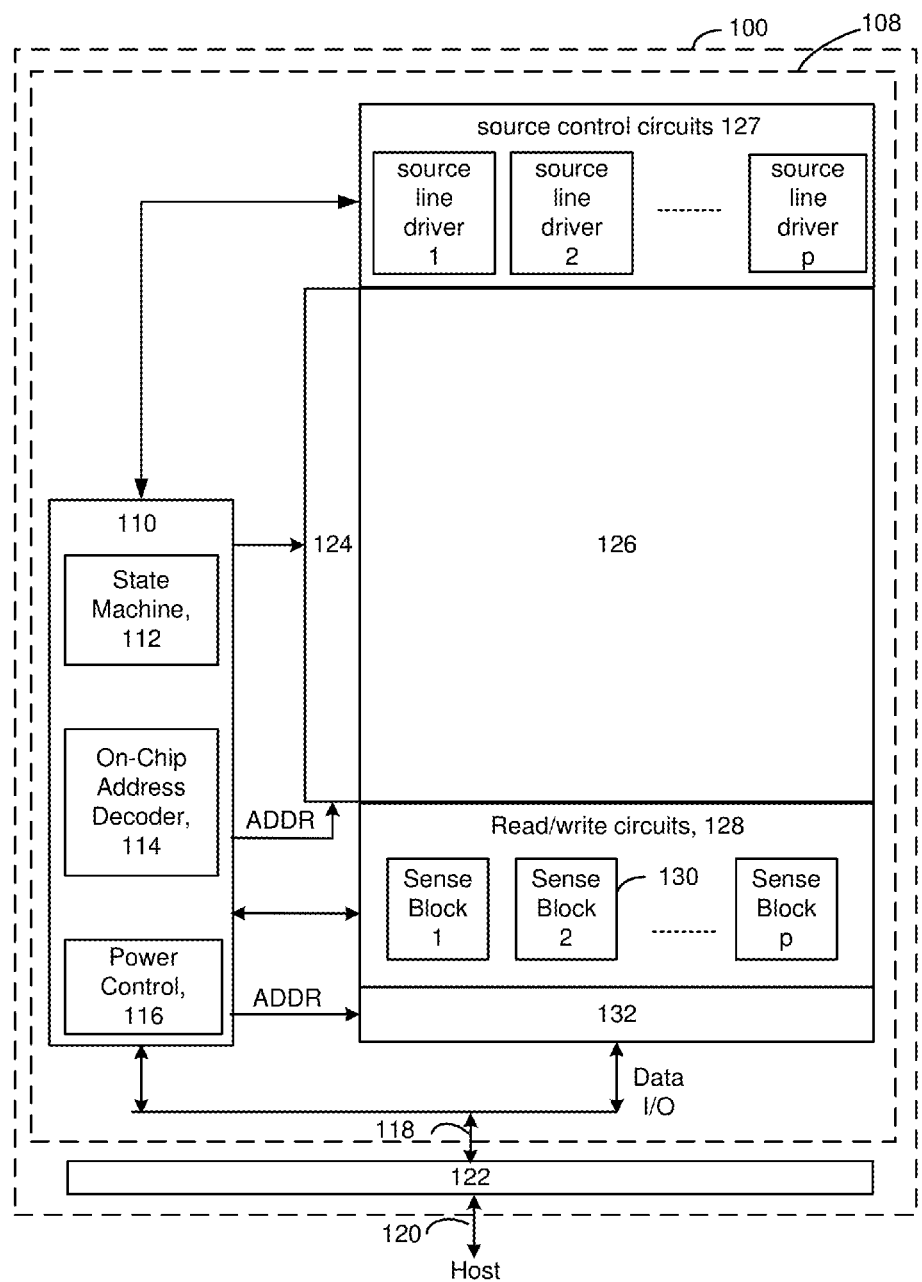
FIG. 1B is a functional block diagram of a memory system that includes the 3D stacked non-volatile memory of FIG. 1A.

FIG. 1B is a functional block diagram of the 3D stacked non-volatile memory device 100 of FIG. 1A. The memory device 100 may include one or more memory die 108. The memory die 108 includes a memory array (or other memory structure) 126 of memory cells, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page (or other unit) of memory cells to be read or programmed in parallel. In some embodiments, a controller 122 is included in the same memory device 100 (e.g., a removable storage card) as the one or more memory die 108. In other embodiments, controller 122 is separated from the memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, source side select lines (SGS) and drain side select lines (SGD) and source lines. The sense blocks 130 include bit line drivers and circuits for sensing. Control circuitry 110 is also in communication with source control circuits 127, which includes source line driver circuit 1, source line driver circuit 2, . . . , source line driver circuit p. The source line driver circuits are used to drive different (or the same) voltages on the individual source lines. The present architecture provides individual control of one source line per active memory cell. Hundreds of thousands (for example about 300,000) of source line driver circuits are required in addition to the same number of bit line driver circuits.

In some implementations, some of the components can be combined. In various designs, one or more of the components (alone or in combination), other than memory array 126, can be thought of as a one control circuit. For example, a control circuit may include any one of, or a combination of, control circuitry 110, state machine 112, decoders 114/124/132, power control module 116, sense blocks 130, source control circuits 127, read/write circuits 128, and controller 122, and so forth.

FIG. 1C and FIG. 1D show the positioning of the memory array 126, source line drivers (SL Driver) and bit line drivers (BL Driver). FIG. 1C shows an embodiment where bit line drivers (BL Driver) are below the memory array 126 and source line drivers (SL Driver) are to the side of memory array 126. FIG. 1C also shows an example source line SL above memory array 126 and an example bit line BL below memory array 126. In one embodiment, the SL Driver includes a unity gain buffer for matching BL voltage during programming and a low Vth single transistor amp (source follower) for subtracting ~0.5V from VBL to apply to SL at other times. FIG. 1D shows the embodiment where bit line drivers (BL Driver) and source line drivers (SL Driver) are below memory array 126. One of the metal layers bellow the memory layer will be consumed. In one embodiment, there would be 3 available metal layers, for example, for connecting the bit line drivers, but only two layers available for connecting the source line drivers. It also means that the layer below the bit line layer becomes a critical layer at minimum pitch (in one example implementation). FIGS. 1 C/D show how bit lines and source lines can coexist without any difficulty encountered when one set try to pass through the other set. No such difficulty exists because one set does not need to try to pass through the other set. FIGS. 1C/D illustrate that both sets can be comfortably connected to their drivers without having to cross each other's metal layers. Any 3D memory architecture that has vertical channels as well as channels fabricated above metal layers (e.g. poly silicon channels as opposed to crystalline silicon channel) can benefit from the attributes of this architecture. Note that crystalline channels require crystalline seed layer of silicon from which the crystalline silicon channel can be grown by epitaxy.

Figure 2:
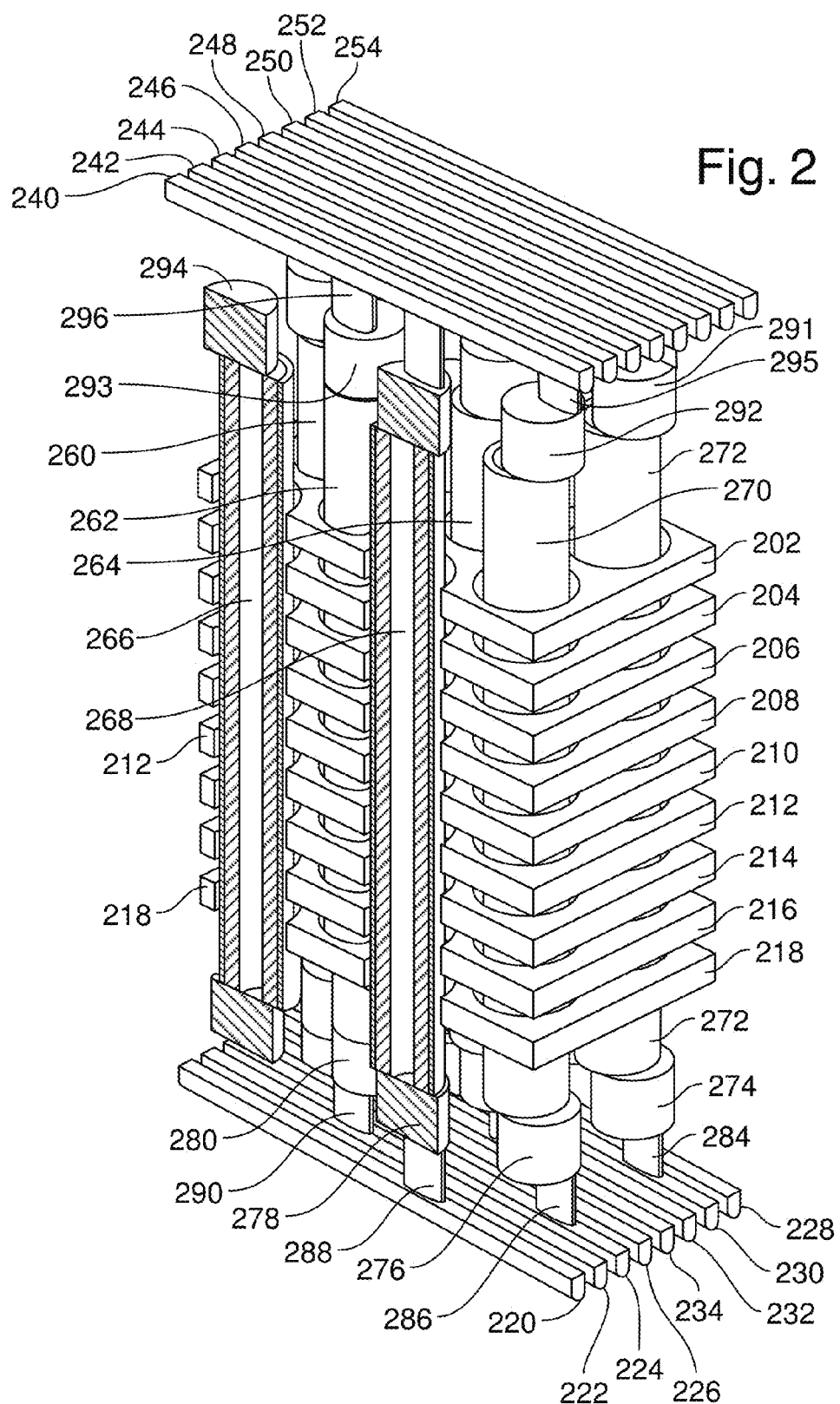
FIG. 2 is a perspective view of a portion of a 3D stacked non-volatile memory.

FIG. 2 is a perspective view of a portion of one embodiment of memory array 126 that is a three dimensional stacked non-volatile memory comprising alternating dielectric layers and conductive layers in a stack, a plurality of bit lines below the stack, and a plurality of source lines above the stack. For example, FIG. 2 shows conductive layers 202, 204, 206, 208, 210, 212, 214, 216, and 218, each of which operates as a word line and, therefore, can be referred to as a word line layer. To allow the drawing to fit on one page and be readable, not all of the conductive layers are depicted. For example, FIG. 2 does not show any of the conductive layers operating as source side select layers (SGSs) and drain side select layers (SGDs). One embodiment may include 60 conductive layers, with 48 conductive layers operating as word line layers, two layers above the 48 word line layers as dummy layers on the source side, four layers above dummy source layers operating as source side select layers (SGS), two layers below the 48 word line layers as dummy layers on the drain side, four layers below dummy drain layers operating as drain side select layers (SGDs). Other embodiments can implement different numbers of word line layers, dummy layers, source side select layers and drain side select layers.

Between the conductive layers are dielectric layers. Many different dielectric materials can be used. One example of a suitable dielectric material is SiO2. Note that FIG. 2 does not show the dielectric material between the conductive layers.

Below the stack of alternating dielectric layers and conductive layers are multiple separate and isolated bit lines 220, 222, 224, 226, 228, 230, 232, and 234. Although FIG. 2 only shows eight bit lines, the memory system is likely to have many more than eight bit lines (e.g. 300,000).

Above the stack of alternating dielectric layers and conductive layers are multiple separate and isolated source lines 240, 242, 244, 246, 248, 250, 252 and 254. Although FIG. 2 only shows eight source lines, the memory system is likely to have many more than eight source lines (e.g. 300,000). In one embodiment, bit line drivers (which include the sense amps) are located below the memory array (stack of layers) while the source line drivers are located to the side of the memory array. In another embodiment, both bit line drivers and source line drivers are located under the memory array. This provides further die size savings at the expense of consuming one of a number of available metal layers over the source line drivers and under the bit lines for connecting the source line drivers to the source lines. The number of available metal layers above the silicon surface and below the bit line layer in certain embodiments is three two or four. This does not include the contact and via layers. If we also count these contact and via layers, the number of metal layers below memory array (including the bit line layer plus its via layer below it, and its via layer above it) add up to nine layers in one embodiment or to eleven layers in another embodiment. Contact and via layers typically provide vertical connectivity in Z direction, whereas the other metal layers provide both vertical and horizontal connectivity within the plane of the chip.

The stack of alternating dielectric layers and conductive layers includes memory holes or pillars which extend vertically in the stack, and comprise a column of memory cells such as in a NAND string. FIG. 2 shows columns/holes/pillars 260, 262, 264, 266, 268, 270, and 272. Although FIG. 2 only shows seven columns, the memory system is likely to have many more than seven columns. As depicted, each conductive layer will surround a set of columns, one memory cell residing at the intersection of each column and each of the conductive layers designated to be function as word lines.

Each bit line is connected to a subset of columns. For example, FIG. 2 shows bit line 230 connected to column 272, bit line 224 connected to column 270, bit line 220 connected to column 268 (note that column 268 is only partially depicted), and bit line 222 connected to column 262. Note that the terms "connected," "coupled" and "in communication with" include direct connections and connections via other components. The bit lines connect to the columns through a combination of vias and plugs. For example, bit line 230 is connected to column 272 by via 284 and plug 274, bit line 224 is connected to column 270 by via 286 and plug 276, bit line 220 is connected to column 268 by via 288 and plug 278, and bit line 222 is connected to column 262 by via 290 and plug 280.

Each source line is connected to a subset of columns. In one embodiment, the source lines connect to the columns through vias and plugs. FIG. 2 shows plugs 291, 292, 293 and 294, as well as vias 295 and 296. Many of the vias for the source lines are hidden due to the perspective view. However, FIG. 2 does show column 270 connected to source line 244 by via 295 and plug 292.

The source lines are not connected together and can carry different signals. In one embodiment, each source line is associated with a bit line to create a source line/bit line pair. The system includes many source line/bit line pairs. Each bit line is associated with a different and separate source line. A source line is connected to the same column as its associated bit line of the source line/bit line pairs. For example, bit line 230 is associated with source line 252 and both are connected to column 272, bit line 224 is associated with source line 244 and both are connected to column 270, bit line 220 is associated with source line 240 and both are connected to column 268, and bit line 222 is associated with source line 242 and both are connected to column 262. In one embodiment, the bit lines are made of Tungsten, the source lines are made of Copper or Tungsten, the vias are made of Tungsten and the plugs are made of polysilicon. In one embodiment, the conductive word line layers are made of Tungsten. Tungsten may be preferable as it can withstand the process thermal budget associated with processing the layers above it, and the required dopant activation or polysilicon channel grain size expansion anneal steps that follow the deposition of the Tungsten.

Figure 3:
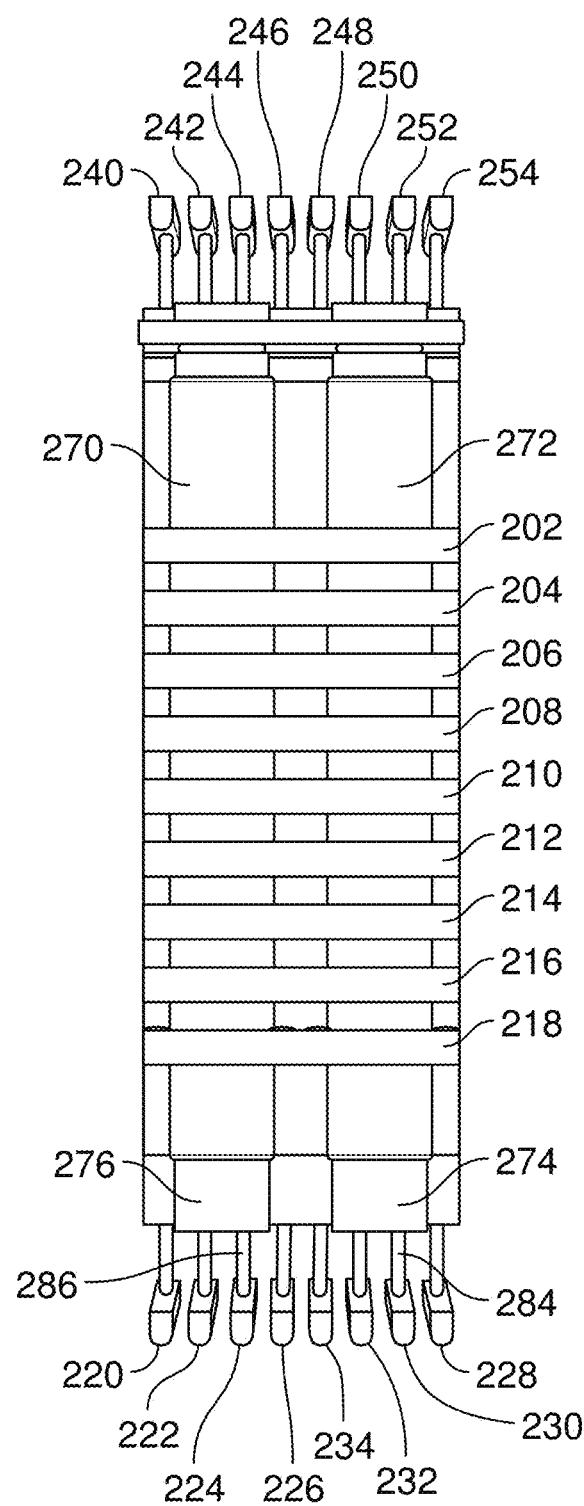
FIG. 3 is a side view of a portion of a 3D stacked non-volatile memory.

FIG. 3 is a side view of the structure depicted in FIG. 2. Like FIG. 2, although FIG. 3 shows conductive layers 202, 204, 206, 208, 210, 212, 214, 216, and 218, FIG. 3 does not explicitly depict the dielectric layers between the conductive layers. Furthermore, FIG. 3 (like FIG. 2) only shows a subset of the conductive layers.

Figure 4:
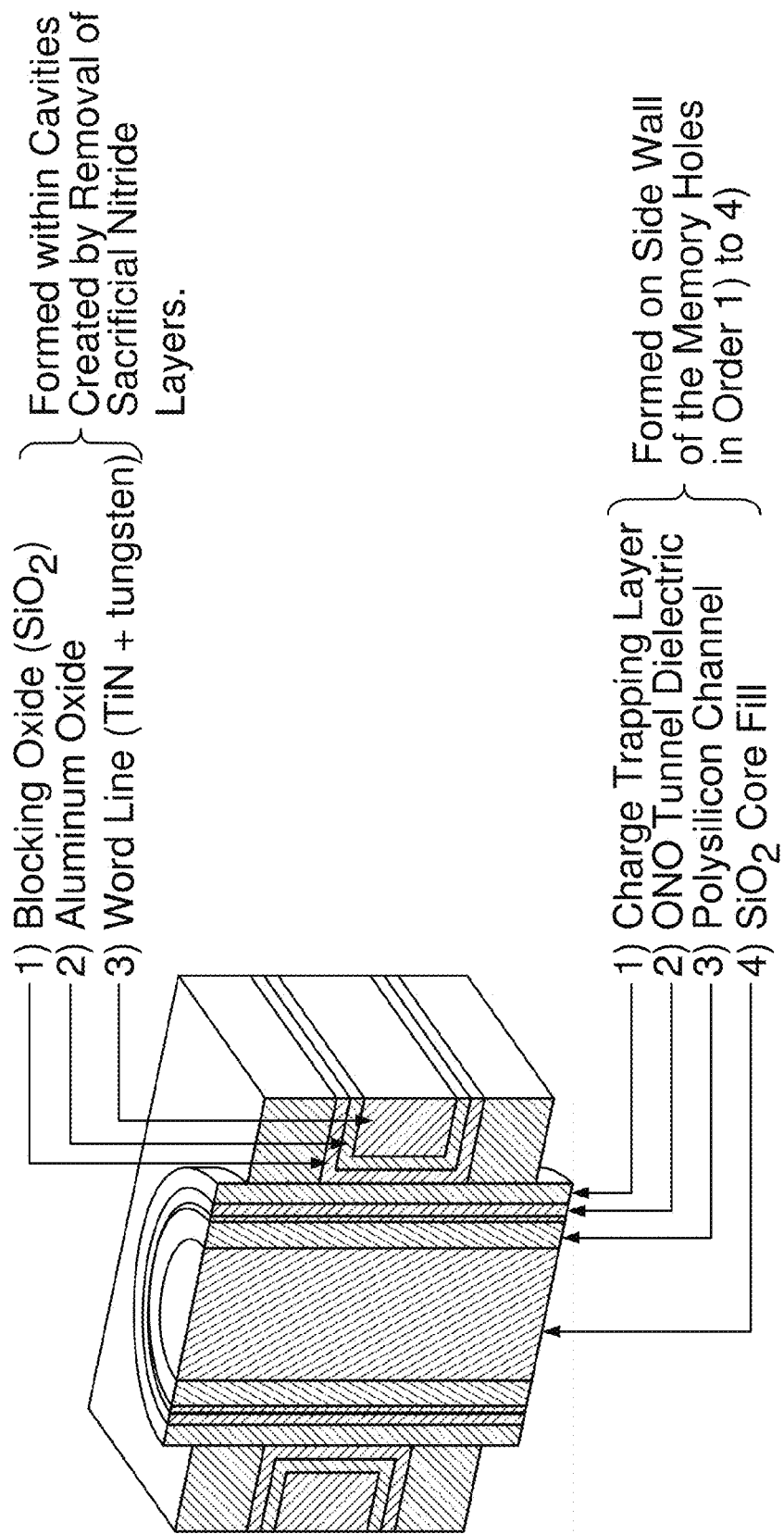
FIG. 4 is a cross sectional and perspective view of a column of the 3D stacked non-volatile memory.

FIG. 4 is a perspective view of a cross section of a column from the memory array 126 (stack) described above. Each column includes a number of layers which are deposited along the sidewalls of the column. These layers formed on the sidewall of the memory holes can include, from the outer perimeter of the hole moving radially in toward the center, a charge trapping layer such as a specially formulated silicon nitride that increases trap density, followed by oxide-nitride-oxide (O—N—O) stack layer that acts as a band gap engineered tunnel dielectric, followed by polysilicon layer (s), followed by the inner most dielectric such as silicon oxide core fill. These layers are deposited using methods such as atomic layer deposition, chemical vapor deposition, or physical vapor deposition. There are many other intermediary steps such as anneals, densifications and sacrificial layers that are temporarily deposited and later removed. The inner most oxide of the ONO tunnel dielectric that is in contact with the polysilicon channel can be created by converting some thickness of the deposited nitride layer to oxide by methods such as ISSG (In-Situ Steam Generation). Other layers of the memory cell structure can be formed by depositions into the horizontal voids left behind after the sacrificial nitride layers are etched out, as opposed to deposition in the memory hole. Such layers can include the silicon oxide blocking layer and the aluminum oxide high K transition layer between the silicon oxide blocking layer and the word line. The word line deposition can start with a titanium nitride layer deposited on aluminum oxide followed by a tungsten seed layer deposition and then the remainder of the cavities for word line fingers can be filled with tungsten. Inside the cavities between word line layers, for example, a blocking oxide (SiO2) can be deposited. The Blocking Oxide surrounds the charge trapping layer. Surrounding the Blocking Oxide, and between the Blocking Oxide and the Word Line (TiN+Tungsten) is an Aluminum Oxide layer. In other embodiments, not shown in FIG. 2, the blocking oxide can be the first layer formed in the memory hole as opposed to the first layer formed in the cavities left behind after the sacrificial nitride layers are removed. The polysilicon channel is connected to a bit line at the bottom of the column and connected to the associated source line at the top of the column through intermediary deposited patterned layers including a metal via and a doped polysilicon plug, as discussed above. The polysilicon plugs can be n-type, preferably doped with some combination of Arsenic or phosphorus, or they can be p-type preferably doped with some combination of Boron or indium. In some embodiments Arsenic and indium are preferable because they diffuse more slowly during high temperature anneals which are required for poly crystalline grain size changes and other purposes.

When a memory cell is programmed, electrons are stored in a portion of the charge trapping layer which is associated with the memory cell. These electrons are drawn into the charge trapping layer from the polysilicon channel, and through the ONO tunnel dielectric. The threshold voltage (Vth) of a memory cell is increased in proportion to the amount of stored charge.

Each of the memory holes is thus filled with a plurality of annular layers comprising sometimes a blocking layer, usually a charge trapping layer, usually a tunnel dielectric multi-layer and a channel layer. A core region of each of the memory holes is filled with a body material, and the plurality of annular layers are between the core region and the WL that surround each of the memory holes.

Figure 5:
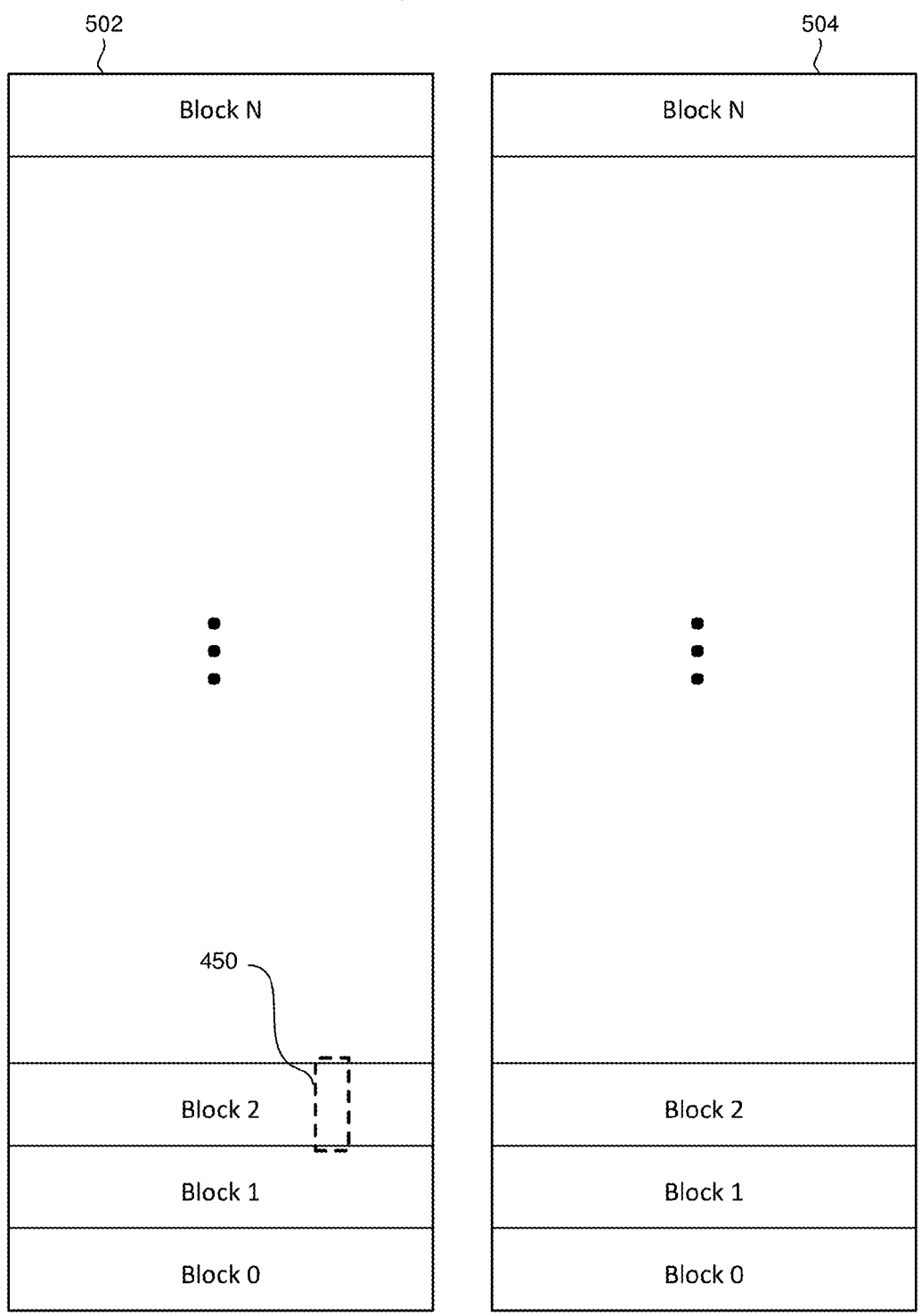
FIG. 5 is a block diagram of a 3D memory array.

Looking back at FIG. 2, memory system 100 includes a memory array 126 having the structure depicted in FIGS. 2, 3, and 4. FIG. 5 is a block diagram explaining the organization of memory array 126, which is divided into two planes 502 and 504. Each plane is then divided into N blocks. In one example, each plane has approximately 2000 blocks. However, different numbers of blocks and planes can also be used.

Figure 6:
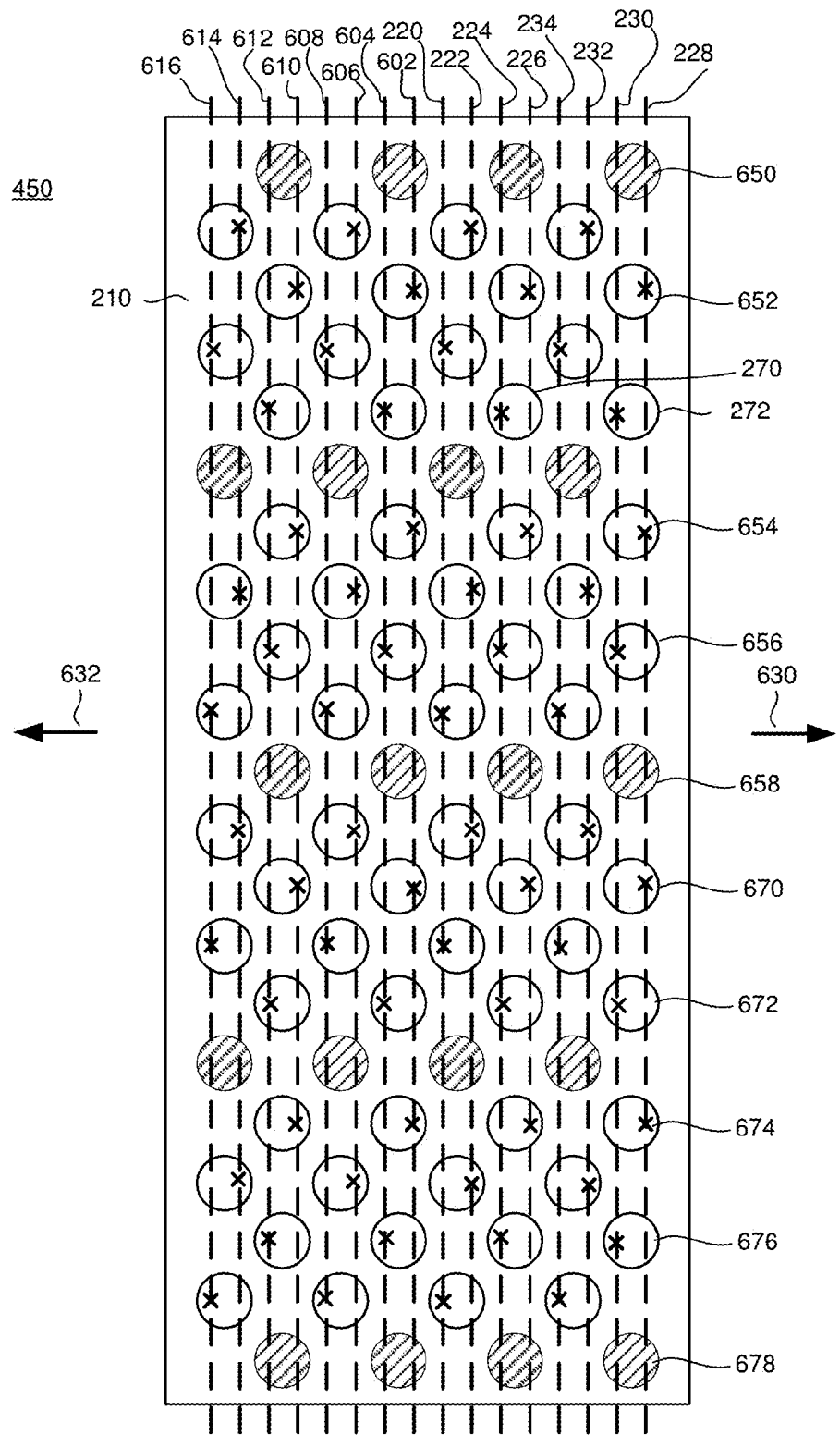
FIG. 6 is a top view of one layer of the 3D stacked non-volatile memory.

FIG. 6 is a block diagram depicting a portion of a top view of one layer of one block. The portion of the block depicted in FIG. 6 corresponds to box 450 in block 2 of FIG. 5. As can be seen from FIG. 5, the block depicted in FIG. 6 extends in the direction of arrow 632 and in the direction of arrow 630. In one embodiment, the memory array will have 48 memory layers; therefore, each block will have 48 layers. However, FIG. 6 only shows one layer. Each layer of a block has only one word line. For example, the layer of block 2 depicted in FIG. 6 includes word line 210 (see FIG. 2) surrounding a plurality of circles. Each circle represents a column (see FIG. 4). FIG. 6 has reference numbers for columns 270 (see FIG. 2), 272 (see FIG. 2), 650, 652, 654, 656, 658, 670, 672, 674, 676 and 678. Not all columns are provided with reference numbers in order to keep FIG. 6 readable. Some of the circles are shaded to indicate that those columns will not be used to store data, and are sacrificed to provide spacing.

FIG. 6 also shows dashed vertical lines. These are the bit lines. FIG. 6 shows sixteen bit lines: 220, 222, 224, 226, 228, 230, 232, 234, 604, 606, 608, 610, 612, 614 and 616. The lines are dashed to indicate that the bit lines are not part of this layer, rather they are below the stack. Each of the non-shaded circles has an "x" to indicate its connection to a bit line.

FIG. 6 does not show the source lines in order to keep the drawing readable. However, the source lines would be in the same position as the bit lines, but located above the stack rather than below. The source lines would connect to the columns in the same manner as the bit lines. Therefore, a source line and its associated bit line of a source line/bit line pair connect to the same column. In this manner, the structure of the source lines is symmetrical to the structure of the bit lines. Thus, for every active column, there is a dedicated bit line and source line. If multiple columns are active at the same time, then each of the active columns has a unique dedicated bit line and a unique dedicated source line.

As can be seen from FIG. 6, each block has sixteen rows of active columns and each bit line connects to four columns in each block. For example, bit line 228 is connected to columns 652, 654, 670 and 674. Since all of these columns 652, 654, 670 and 674 are connected to the same word line 210, the system uses the source side select lines and the drain side select lines to choose one (or another subset) of the four to be subjected to a memory operation (program, verify, read, and/or erase).

Figure 7:
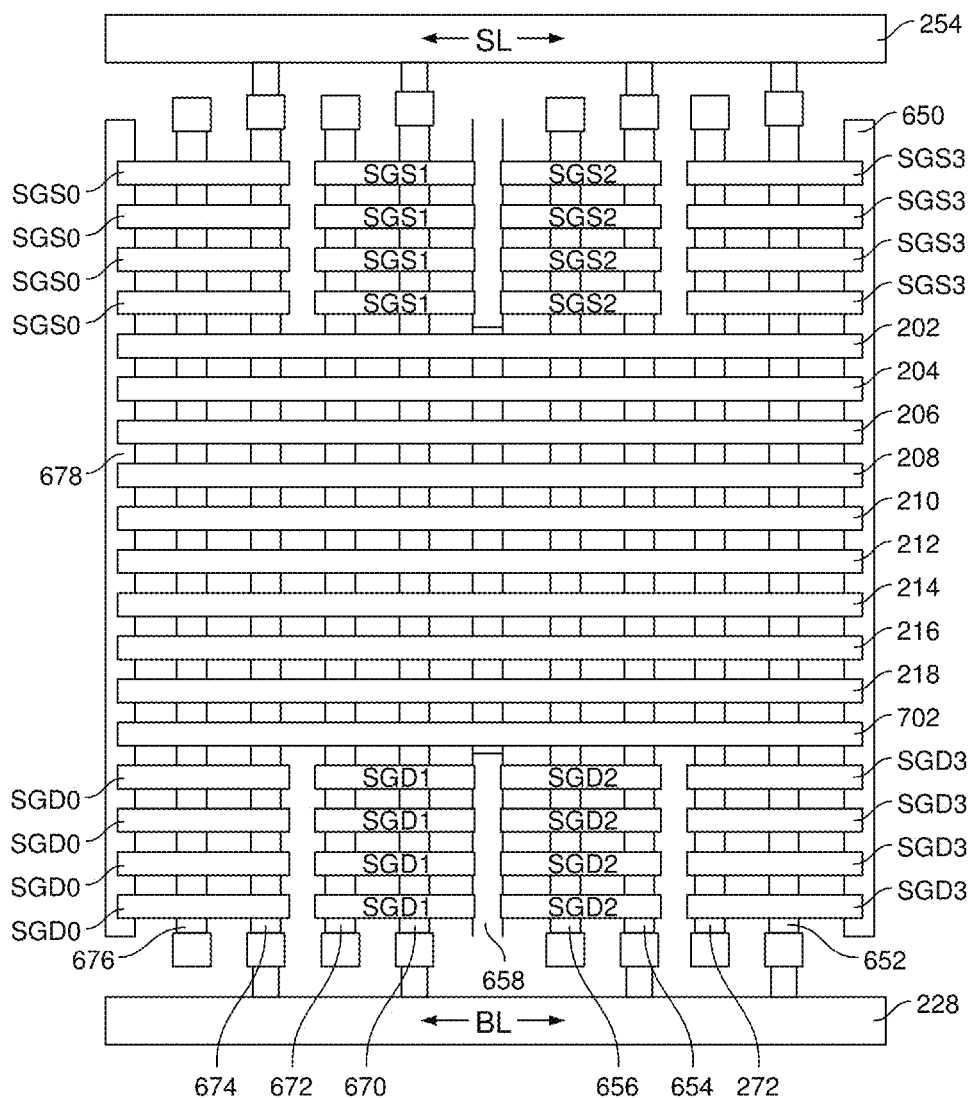
FIG. 7 is a side view of a portion of a 3D stacked non-volatile memory.

FIG. 7 is a side cutaway view of a portion of the memory array, along bit line 228 and source line 254. Note that bit line 228 is the associated bit line for source line 254, therefore, forming a source line/bit line pair. FIG. 7 shows that while the word line layers extend across the entire block, the source side select lines and the drain side select lines are broken up into four sections. In one embodiment, each source side select line is implemented as four vertical layers connected together. Within each block, there are source side select lines: SGS0, SGS1, SGS2 and SGS3. Similarly, the drain side select lines are implemented as four vertical layers connected together. Within each block, there are four drain side select lines: SGD0, SGD1, SGD2 and SGD3. In one embodiment, SGS0 and SGD0 are used to control columns 674 and 676, SGS1 and SGD1 are used to control columns 672 and 670, SGS2 and SGD2 are used to control columns 654 and 656, and SGS3 and SGD3 are used to control columns 272 and 652.

FIG. 8 illustrates example threshold voltage distributions for the memory cell array when each memory cell stores three bits of data. Other embodiments, however, may use more or less than three bits of data per memory cell (e.g., such as two bits of data per memory cell, or four bits of data per memory cell). In the example of FIG. 8, there are eight valid threshold voltage distributions, also called data states (or target states): S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8. In other embodiments, memory cells can be programmed using a coarse/fine methodology or other scheme.

FIG. 8 shows a set of verify target levels Vv1, Vv2, Vv3, Vv4, Vv5, Vv6, and Vv7. These verify levels are used as comparison levels (also known as target levels and/or compare levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine for which states that memory cells are storing data. In one embodiment, Vr1=0.2v, Vr2=1.0v, Vr3=1.8v, Vr4=2.6v, Vr5=3.4v, Vr6=4.2v and Vr7=5.0v. However, other values can also be used.

In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 8) or verify operation (e.g. one voltage is used to verify all states, as discussed below) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells on selected columns (i.e. NAND chains) corresponding to a selected word line (i.e. finger) are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier while maintaining a specified bit line voltage. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, the program voltage applied to the control gate includes a series of pulses that are increased in magnitude with each successive pulse by a predetermined step size (e.g. 0.2v, 0.3v, 0.4v, 0.6v, or others). Between pulses, some memory systems will verify whether the individual memory cells have reached their respective target threshold voltage ranges.

FIGS. 9A-9E depict one example programming process that uses six Vpgm program pulses on the selected word line to achieve threshold voltage distributions as per FIG. 8. Initially, in one embodiment, all memory cells being programmed are erased to data state S0. After erasing, a first Vpgm program pulse is applied. In one embodiment, the first Vpgm program pulse is at 19v. All memory cells being programmed will receive that same Vpgm program pulse. However, data dependent voltages are individually applied to the different bit lines and the different source lines so that memory cells being programmed to higher data states (e.g., S7) will increase in threshold voltage more quickly and memory cells being programmed to lower data states (e.g., S1) will increase in threshold voltage slower. The voltages applied to the bit lines and source lines are based on the target data state. Therefore, all memory cells being programmed to S1 will be subjected to a first bit line voltage and a first source line voltage, all memory cells being programmed to S2 will be subjected to a second bit line voltage and a second source line voltage, all memory cells being programmed to S3 will be subjected to a third bit line voltage and a third source line voltage, all memory cells being programmed to S4 will be subjected to a fourth bit line voltage and a fourth source line voltage, all memory cells being programmed to S5 will be subjected to a fifth bit line voltage and a fifth source line voltage, all memory cells being programmed to S6 will be subjected to a six bit line voltage and a six source line voltage, and all memory cells being programmed to S7 will be subjected to a seventh bit line voltage and a seventh source line voltage.

FIG. 9A depicts the results of applying the first Vpgm program pulse. FIG. 9A shows the target data states in solid lines and shows the actual threshold voltage distributions in dashed lines 802, 804, 806, 808, 810, 812 and 814. Actual threshold voltage distribution 802 represent the threshold voltage distribution for memory cells being programmed to data state S1. Actual threshold voltage distribution 804 represent the threshold voltage distribution for memory cells being programmed to data state S2. Actual threshold voltage distribution 806 represent the threshold voltage distribution for memory cells being programmed to data state S3. Actual threshold voltage distribution 808 represent the threshold voltage distribution for memory cells being programmed to data state S4. Actual threshold voltage distribution 810 represent the threshold voltage distribution for memory cells being programmed to data state S5. Actual threshold voltage distribution 812 represent the threshold voltage distribution for memory cells being programmed to data state S6. Actual threshold voltage distribution 814 represent the threshold voltage distribution for memory cells being programmed to data state S7. Note that the height/magnitude of the actual threshold voltage distributions 802, 804, 806, 808, 810, 812 and 814 is somewhat exaggerated in Figures A-E in order to make the drawings easier to read.

FIG. 9B depicts the results of applying the second Vpgm program pulse. As depicted, actual threshold voltage distributions 802, 804, 806, 808, 810, 812 and 814 have moved toward higher voltages. The second Vpgm pulse is applied to all of the memory cells being programmed. The system is not programming in six iterations to successively move memory cells from lower states to successively higher states, as the initial Vpgm program pulse already moved memory cells to each of the distributions (802-814). Certain memory cells will be in the target data state after the first Vpgm program pulse. The system is using multiple programming iterations to tighten up the threshold voltage distributions for each data state, not to progressively move higher data state memory cells to those higher data states.

FIG. 9C depicts the results of applying the third Vpgm program pulse. As depicted, actual threshold voltage distributions 802, 804, 806, 808, 810, 812 and 814 have moved toward higher voltages.

FIG. 9D depicts the results of applying the fourth Vpgm program pulse. As depicted, actual threshold voltage distributions 802, 804, 806, 808, 810, 812 and 814 have moved toward higher voltages.

FIG. 9E depicts the results of applying the fifth Vpgm program pulse. As depicted, actual threshold voltage distributions 802, 804, 806, 808, 810, 812 and 814 have moved toward higher voltages. After the sixth Vpgm program pulse, the actual threshold voltage distributions should be the same (or close) to the threshold voltage distributions depicted in FIG. 8.

Figure 10:
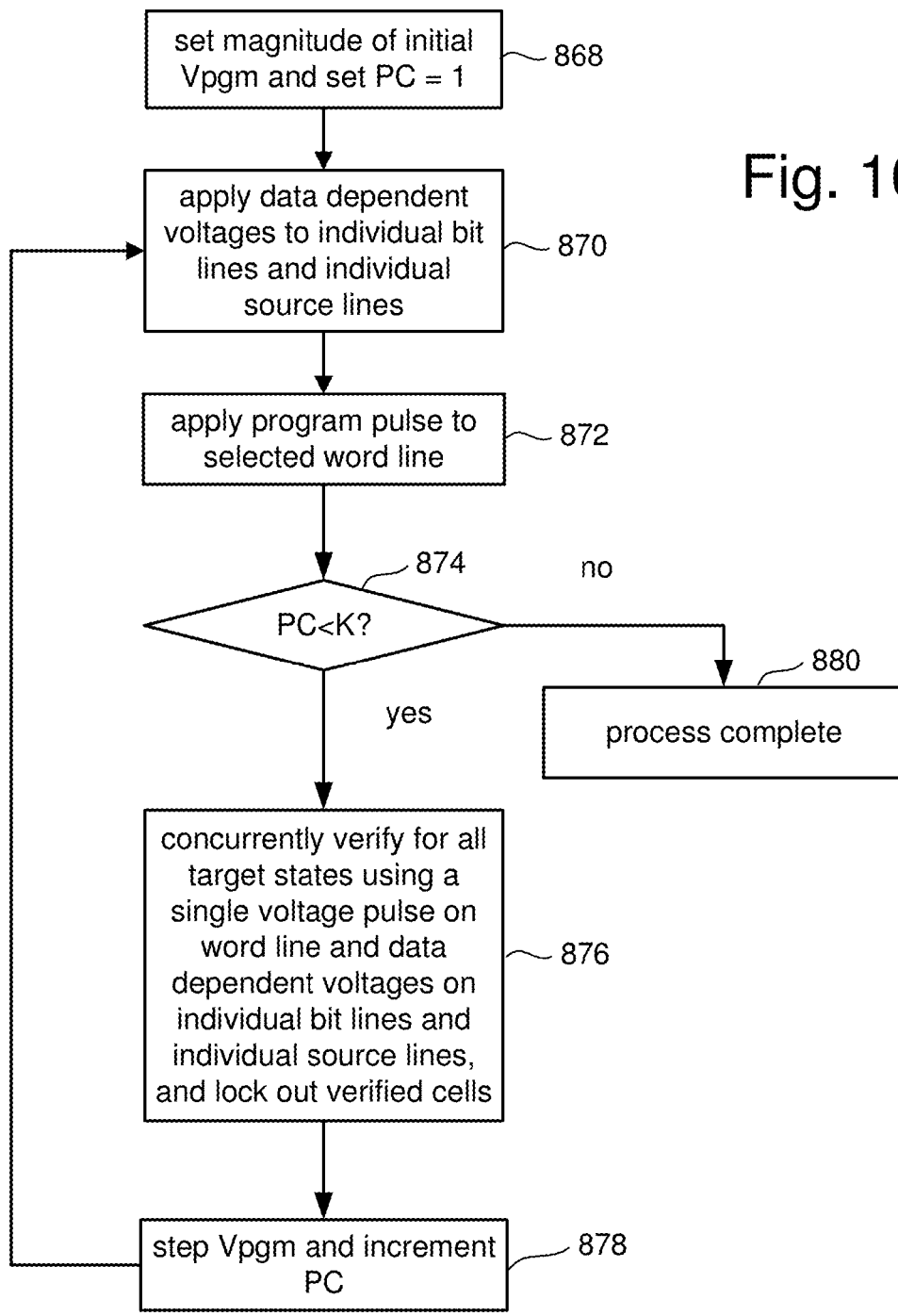
FIG. 10 is a flow chart describing one embodiment of a process for programming.

FIG. 10 is a flow chart describing one embodiment of a process for performing programming on memory cells connected to a common word line to one or more targets (e.g., data states or threshold voltage ranges). The process of FIG. 10 is one example of how to implement the behavior depicted in FIG. 9. The process of FIG. 10 can also be used to implement programming strategies different than that of FIG. 9.

Typically, the program voltage applied to the control gate during a program operation is applied as a series of program pulses. Between programming pulses the system will perform verification. In many implementations, the magnitude of the program pulses is increased with each successive pulse by a predetermined step size. In step 868 of FIG. 10, the programming voltage (Vpgm) is initialized to the starting magnitude (e.g., ~19V or another suitable level) and a program counter PC maintained by state machine 112 is initialized at 1. In step 870, data dependent voltages are individually applied to the different bit lines and the different source lines. Data dependent voltages are voltages that vary based on the data pattern being programmed. More details of step 870 are discussed below with respect to FIG. 11. In step 872, a program pulse of the program signal Vpgm is applied to the selected word line (the word line selected for programming) In one embodiment, the group of memory cells being programmed concurrently are all connected to the same word line (the selected word line). In step 872, the program pulse is concurrently applied to all memory cells connected to the selected word line.

In step 874, it is determined whether the program counter PC is less than K. In one embodiment, K=6, which means that the programming process will apply six programming pulses. The number 6 is based on the assumption that the natural VT distribution is about 3V wide and that the average VT shift up per program pulse is 0.5V, so 3.0/0.5=6 pulses. If the step size is changed or the assumption about the width of the natural distribution is wrong, then more or less pulses are needed. The technology described herein can be used with K>6 and K<6. The natural distribution is the response (i.e. new VT distribution) of a group of cells to a single program pulse when the same program pulse (or the same sequence of program pulses) is (are) applied to all of cells. The group of cells can be composed of, for example, all cells to be programmed on a word line, all cells to be programmed to a particular state on a word line, all cells on a block, all cells on a chip, all cells across many chips depending on the context in which the term natural VT distribution is used. Generally the larger the group of cells under consideration, the wider the natural distribution from end to end. FIG. 9A shows seven different natural distributions (one per program state) where each one is the outcome for cells to be programmed to a particular state, and these outcomes are different due to the fact that lower states' programming is retarded by virtue of applied higher voltages to the cell's source line and bit line. The lower the state, the higher the retarding potential transferred to its channel by application of these higher voltages to bit lines and source lines.

If the program counter PC is less than K, then the process continues at step 876, during which all of the memory cells being programmed are concurrently verified for all target data states using a single read voltage pulse on the selected word line and data dependent voltages on individual bit lines and individual source lines. Memory cells that verify successfully will be locked out from further programming for the remainder of the programming process. In step 878, the Program Counter PC is incremented by 1 and the program voltage Vpgm is stepped up to the next magnitude. After step 878, the process loops back to step 870 and another program pulse is applied to the selected word line. In one embodiment, the six program pulses are at 19v, 19.6v, 20.2v, 20.8v, 21.4v and 22v.

If, in step 874, it is determined that the program counter is not less than K (i.e. PC=K) then the programming process of FIG. 10 is complete. In this embodiment, there is no verification performed for the last program pulse. In other embodiments, verification can be performed for the last program pulse and the system can (optionally) determine whether enough memory cells have been successfully programmed.

Steps 870-878 implement a loop of applying programming and then verifying. This process is performed in an iterative fashion to avoid over programming.

FIG. 11 is a table that identifies one embodiment of data dependent source line voltages and bit line voltages for programming, verifying and reading. Step 870 of FIG. 10 includes applying data dependent voltages to individual source lines and bit lines for programming. The second column of FIG. 11 (header of "Program") identifies the data dependent voltages applied to individual source lines and the seventh column of FIG. 11 (header of "Program") identifies the data dependent voltages applied to individual bit lines. For example, if a memory cell is being programmed to state S1, then in step 870 the source line receives 4.8 volts and the bit line receives 4.8 volts. If a memory cell is being programmed to state S2, then in step 870 the source line receives 4.0 volts and the bit line receives 4.0 volts. If a memory cell is being programmed to state S3, then in step 870 the source line receives 3.2 volts and the bit line receives 3.2 volts. If a memory cell is being programmed to state S4, then in step 870 the source line receives 2.4 volts and the bit line receives 2.4 volts. If a memory cell is being programmed to state S5, then in step 870 the source line receives 1.6 volts and the bit line receives 1.6 volts. If a memory cell is being programmed to state S6, then in step 870 the source line receives 0.8 volts and the bit line receives 0.8 volts. If a memory cell is being programmed to state S7, then in step 870 the source line receives 0.0 volts and the bit line receives 0.0 volts. If the memory cell is to remain in the erased state S0, then in step 870 the source line receives 6.0 volts and the bit line receives 6.0 volts. Once a decision has been made based on one of the verify operations to lock out any particular cell from further programming (due to cell's VT exceeding its verify level), then from that point on the cell/column will be treated the same way as an erased cell (i.e. it will be locked out of further programming by boosting or other methods that inhibit programming).

Step 876 of FIG. 10 includes applying data dependent voltages to individual source lines and bit lines for verifying. The fourth column of FIG. 11 (second row has header of "Verify") identifies the data dependent voltages applied to individual source lines and the ninth column of FIG. 11 (second row has header of "Verify") identifies the data dependent voltages applied to individual bit lines. For example, if a memory cell is being programmed to state S1, then in step 876 the source line receives 4.8 volts and the bit line receives 5.3 volts. If a memory cell is being programmed to state S2, then in step 876 the source line receives 4.0 volts and the bit line receives 4.5 volts. If a memory cell is being programmed to state S3, then in step 876 the source line receives 3.2 volts and the bit line receives 3.7 volts. If a memory cell is being programmed to state S4, then in step 876 the source line receives 2.4 volts and the bit line receives 2.9 volts. If a memory cell is being programmed to state S5, then in step 876 the source line receives 1.6 volts and the bit line receives 2.1 volts. If a memory cell is being programmed to state S6, then in step 870 the source line receives 0.8 volts and the bit line receives 1.3 volts. If a memory cell is being programmed to state S7, then in step 874 the source line receives 0.0 volts and the bit line receives 0.5 volts. If the memory cell is to remain in the erased state S0, then in step 874 the source line receives 6.0 volts and the bit line receives 6.0 volts.

Step 870 of FIG. 10 also include locking out memory cells that have been successfully verified to have reached their target data state. The third column of FIG. 11 (second row has header of "Lock out") identifies the data dependent voltages applied to individual source lines and the tenth column of FIG. 11 (second row has header of "Lock out") identifies the data dependent voltages applied to individual bit lines. In all cases, when a memory cell is locked out the source line and bit line are set at 6 volts. Any memory cell that should be inhibited from programming has its source line and bit line set to 6.0 volts, as per the third and eighth columns of FIG. 11 (second row has header of "Inhibit"). Note that the numerical values listed in FIG. 11 are examples, and other values can also be used.

Because memory cells being programmed to lower states receive higher source line voltages and bit line voltages, the programming pulses will cause the memory cells being programmed to lower states to increase threshold voltage at a lower rate, as per the graphs of FIGS. 9A-E. Similarly, because memory cells being verified for lower states receive higher source line voltages and bit line voltages, the verification test can use the same single verification voltage pulse on the selected word line. FIG. 13 shows a sample voltage signal applied to a selected word line. There are six Vpgm program pulses 557, 558, 559, 560, 561 and 562 that increase in magnitude, as described above. One of the program pulses is applied during each iteration of step 872 of FIG. 10. Between the Vpgm program pulses are verify pulses 570. That is, between any two Vpgm program pulses is one verify pulse that is used to concurrently verify all data states by using different source line and bit line voltages as per the table of FIG. 11. Concurrently verifying all data states saves considerable time during a programming process. One verify pulse 570 is applied during each iteration of step 874.

FIG. 12 is a table that provides example voltages for the drain side select signal (VSGD), source side select signal (VSGS), selected word line (WL N), unselected word lines on the source side of the selected word line (WL#≤N−1), and unselected word lines on the drain side of the selected word line (WL#≥N+1). For example, during verify operations the selected word line receives one voltage pulse at 5.2 volts, while the unselected word lines, source side select signal for the selected NAND string, and drain side select signal for the selected NAND string receive 6 volts, and while the unselected word lines on the source side receive 12 volts. Other voltages than 6V can be applied, and engineering optimization will determine the best voltages to apply to unselected word lines, various source side select gates, and various drain side select gates during both verify and program operations. During programming, the selected word line receives Vpgm (see FIG. 13), while the unselected word lines on the drain side, the source side select signal for the selected NAND string, and the drain side select signal for the selected NAND string receive 6 volts, and while the unselected word lines on the source side receive 12 volts. During reading, the selected word line receive Vcgr (ie Vr1, Vr2, Vr3, Vr4, Vr5, Vr6 or Vr 7), the source side select signal for the selected NAND string receives 4 volts, the drain side select signal for the selected NAND string receives 4 volts, and all unselected word lines receive 7 volts. Note that the numerical values listed in FIG. 12 are examples, and other values can also be used.

FIG. 14 is a flow chart describing one embodiment of a process for verifying that is performed as part of step 876 of FIG. 10. The process of FIG. 14 is one way to concurrently verify all data states, which is much faster than previous approaches which verify data states serially one data state at a time. In step 902, the individual bit lines receive a data dependent signal, as discussed above, and the individual source lines receive a data dependent signal, as discussed above. In some embodiments the system continues to apply the voltage (i.e. hold the voltage), rather than bring down the voltages applied to bit lines and source lines at the end of a program pulse by discharging them, only to recharge them back up to the same (or similar) voltage for following verify operation. This saves energy.

In step 904, the drain side selection signal is applied. In step 906, the source side selection signal is applied. Steps 904 and 906 can be performed concurrently or sequentially. If performed sequentially, either 904 or 906 can be performed first. In step 910, the set of sense amplifiers concurrently perform sensing operation for all (or a subset) of the memory cells for all data states. That is, the system will sense for S0, S1, S2, S3, S4, S5, S6 and S7 at the same time. Note that in some embodiments, for verifying after the first program pulse, WLs, SGSs, SGDs, BLs, & SLs can all start to rise together in order to save time. They will reach final voltage values at different times.

In another embodiment, the system can start ramping up (raising the voltage of) the word lines, the select gates, the bit lines, and the source lines all together for the selected finger (i.e. word line). The bit lines and the source lines can be slower to rise due to either their RC time constants being longer or the energy requirements being more (which would necessitate an intentional controlled ramp up of these ~600,000 lines in order not to exceed maximum allowed instantaneous currents), in some embodiments word lines and select gates will reach high voltages before bit lines and source lines reach high voltages. Note that one embodiment charges the bit lines and the source lines in two stages: stage 1 takes lines to VCC or less, and stage 2 takes those lines that have to go to higher than VCC values from VCC to these higher values. Each stage is allotted a minimum of 20 micro seconds based on worst case bit line or source line RC time constants. The maximum time for each stage is based on how many cells will require their bit lines and source lines to be raised in voltage during the BL/SL charging phase which occurs before each program pulse. Some program pulses will have very few numbers of BLs and SLs charging up to high voltages (e.g. charge ups for program pulses #2 & #6, for which the circuit is RC dominated and 20 us per stage will be adequate. But there are other charging phases when the system needs to allow more than 20 us per one or both stages of charge up before the associated program pulse. Thus, there is a pulse by pulse control of ramp up time and pulse dependent charge up times. There may be a lot of BL & SL charge up activity prior to program pulse #1.

FIG. 15 is a flow chart describing one embodiment of a process for reading. Unlike verification, reading is performed sequentially. That is, the system will perform a read operation for one data state at a time. In one embodiments, the system will first read to determine which memory cells are in S0, then S1, then S2, . . . S7. In other embodiments, other orders can be implemented. Each data state is associated with its own word line voltage, referred to as Vcgr (ie Vr1, Vr2, Vr3, Vr4, Vr5, Vr6 or Vr 7). In step 950, the Vcgr voltage for the compare level (ie Vr1, Vr2, Vr3, Vr4, Vr5, Vr6 or Vr 7) is applied to the selected word line. Additionally, the unselected word line receive the voltages indicated in FIG. 14. In step 952, the drain side selection signal is applied. In step 954, the source side selection signal is applied. In step 956, the common bit line voltage is applied to all bit lines. In step 958, the common source line voltage is applied to all source lines. In step 960, the sense amplifiers will sense data for the Vcgr applied in step 950. If there are more compare levels to apply (step 962), then the process loops back to step 950. In one set of embodiments, there are seven compare levels, so there will be seven iteration of steps 950-960. When there are no more compare levels to evaluate (step 962), then the process continues at step 964 the system determines which data state each memory cell read is in and what the corresponding data stores is. That data is reported to the host.

Note that the processes of FIG. 10 (programming), 14 (verifying) and 15 (reading) can be performed together in any combination, separate, concurrently, serially or in another manner.

In one embodiment, erasing is performed in the same manner as in the prior art. In another embodiment, erasing is performed by taking advantage of Gate Induced Drain Leakage ("GIDL"). In another embodiment, erasing is performed by the "gated diode effect," which comprises electron-hole generation assisted by bias across a PN junction and a nearby gate's assisting in increasing the electric field needed to generate electron hole pairs.

In one embodiment, immediately after programming, a read operation is performed to make sure that the bit error rate is sufficiently low. Note that ECC can be used to fix a number of bit errors.

FIG. 16 is a table of voltages used during programming and verification of programming for selected word lines (WLn) in selected block for program/verify and shows the transition of waveforms for the first two program pulses and the associated verify operations. The remaining operations are the same as the second program pulse (i.e. repeats of stages 2.1 to 2.7). The last program pulse (6th pulse in this example) does not require a verify in some embodiments and its stages 6.1 to 6.5 are similar to other program pulses' corresponding stages. An addition step 6.6 during which all lines are brought back to ground will bring the program verify sequence to an end. The voltages and timings serve as examples and can be different in various scenarios. Even the sequence of events can be changed to some extent. Other than the first column of labels, each column shows voltages during a different stage of operation. The first program pulse has seven stages: 1.1, 1.2, 1.3, 1.4, 1.5, 1.6 and 1.7. The second program pulse also has seven stages: 2.1, 2.2, 2.3, 2.4, 2.5, 2.6 and 2.7. Stages 1.1, 1.2 as well as 2.1 and 2.2 are an example implementation of step 870 of FIG. 10. Stages 1.4 and 1.5 as well as 2.4 and 2.5 are example implementation of step 872 of FIG. 10. Stages 1.7 and 2.7 are example implementations of step 876 of FIG. 10, as well as the process of FIG. 14. The table shows voltages for the four source side select lines (SGS0, SGS1, SGS2, SGS3), the four drain side select lines (SGD0, SGD0, SGD0, SGD3), the two drain side dummy word lines (WLDD1, WLDD2), the two drain side dummy word lines (WLDS1, WLDS2), the selected word line WLN, unselected word lines (WL0, WL<N−1, WLN−1, WLN+1, WL>N+1, WL47), source lines and bit line. With respect to the stage number, the digit to the left of the decimal point indicates the program pulse associated with the iteration of the programming process and the digit to the left of the decimal point refers to the sub stage (0.1-0.7).

The first two sub stages for the first program pulse include setting the various bit line and source voltages to their data dependent values. This is done in two stages, with the first stage (1.1) bringing the bit lines and source line to the lower of their target or VCC (~3.1v). The other signals are depicted to transition from 0 to the values noted. For example, SGS0 shows "0→8" which represents a transition from 0 volts to 8 volts. In the second stage (1.2), the bit lines and source lines are raised from VCC to their targets (if they were not already at their targets). In third stage (1.3), the drain side select lines and source side select lines are lowered. The third stages (i.e. 1.3, 2.3, . . . , 6.3) can be eliminated in some embodiments for all program verify pulses. If they are to be eliminated, then select gate source and drain voltages are raised only to 6v as opposed to 8v in the first stages (i.e. 1.1, 2.1, . . . , 6.1). In the fourth stage, the word lines are raised to Vpass (e.g., 7-10 volts) to boost unselected NAND strings and prevent program disturb. In the fifth stage (1.5), the program pulse is applied. In the sixth stage (1.6), the system transitions to verify without bringing all of the signals down to 0 volts. In one embodiment, the system transitions to verify without bringing any of the listed signals down to 0 volts (or another resting or transition voltage). In the seventh stage, concurrent verification is performed. The stages for the second and subsequent program pulses are similar to the first program pulse, except in the first stage (e.g., 2.1, 3.1, 4.1, 5.1, and 6.1), the transition of voltages is from the previous verify voltage levels rather than 0. For some of the sub stages, the bit line voltage shows "x or 6" which represents applying the data dependent value x or 6 volts because the memory cell is locked out.

Note that chart of FIG. 16 shows the voltages for SGS0, SGS1, SGS2, and SGS3 as well as SGD0, SGD0, SGD0, and SGD3. The depicted voltages are for the instances when the particular select lines are selecting the NAND strings that include the selected memory cells. Typically, only one of SGS0, SGS1, SGS2, and SGS3 and only one of SGD0, SGD0, SGD0, and SGD3 will be active at a time and the other three of each type of select line will be inactive (e.g., at 0 volts). In one embodiment, all four SGSs are tied to each other and you turn them all OFF or ON. In another embodiment, a four SGS lines are individually controlled since they are the one on the top and a shallow etch can separate the SGS lines. It may be possible to select one of the 4 word lines fingers by SGS selection as opposed to by SGD selection. If this possibility can be obtained, then one embodiment we will not have to bother with the extra process steps required to create 4 SGSs as well as 4 SGDs.

In one embodiment, the memory system does not necessarily have to have its bit lines below memory layers and its source line above. There can be embodiments with bit lines above the memory and source lines below the memory.

There is a description above of two stage charging for the bit lines and source lines. In other embodiments, three stage charging can be used for the bit lines and source lines. Three stage charging could become useful, if VCC<6/2=(BL/SL voltage for inhibit)/2. Then stage 1 takes the lines to VCC or below, stage 2 to takes the lines to slightly lower than 2*VCC, and stage 3 takes the lines to voltages above slightly lower than 2*VCC.

The above-described architecture reduces the number of program pulses and verify pulses, which results in an increase in performance of the memory system. As described, the time needed for verification is dramatically reduced as all states are verified simultaneously. Additionally, because the bit lines are below the stack, there is no need for bit line interconnects that run from below to above the stack, which saves space. Since there is only one word line per block per level, as opposed to multiple word lines on a level, the word line RC is reduced and less space is needed. Additionally, locating the bit line drivers (sense amplifiers) below the stack also save room on the integrated circuit.

If, in some embodiments, programming all states concurrently or verifying all states concurrently proves too costly (e.g. too much leakage or disturb, or too complex the BL drivers), the system can instead deploy a scheme that would break each program pulse into two sets: one set geared for states A, B, C and the other set geared for states D, E, F, and G for example. For A to C states the Vpgm pulse will start at 16.2V, and when D to G are to be programmed the first pulse for these states starts at 19V. Verify can also be broken up into two sets. This provides semi-concurrency. It will reduce the performance gain and may increase energy per bit programmed, but it may be the last resort to mitigating junction leakages, disturb problem due to very high bit line and source line voltages of full concurrent program and verify, or reducing the number of transistor in each of the ~300,000 bit line drivers. Also, since it will reduce bit line and source line voltage requirements, it will be able to eliminate or significantly reduce the need to pump up the bit line and source line voltages that have to charge up and maintain voltages significantly higher than VCC.

Another embodiment includes adding more pads to memory chips to bring in other voltage supplies in addition to VCC. For example, the system can bring as many as 6 other voltages from the outside onto the chip (not just 0v & VCC). An example would be to supply 0, 0.8, 1.6, 2.4, 3.2, 4.0, 4.8, & 6.0V from outside the chip. Another example is to bring 0, 0.9, 1.7, 2.5, 3.3, 4.1, 4.9, and 6.1V from outside and regulate them down to supply 0, 0.8, 1.6, 2.4, 3.2, 4.0, 4.8, & 6.0V. This will allow the memory chips to run a lot cooler by not having to use charge pumps to pump up about 600,000 bit lines and source lines to voltages that go as high as 6V. On solid states drives (e.g., SSDs and ESSDs) it may be easier to generate these voltages off chip. If these pads are on the chip and the circuits that accompany them as well, the system will have the option to use them or not depending on the type of product being offered.

Looking back at FIG. 8, full sequence programming is depicted by the arrows from data state S0 to data states S1-S7. Rather than implement full sequence programming, or in addition to implementing full sequence programming, some embodiments implement high states first programming (also known as HSF programming). In general, HSF programming is a multi-pass programming process. During an earlier pass of the multi-pass programming process memory cells to be programmed to the higher data states are programmed and during a later pass of the multi-pass programming process memory cells to be programmed to the lower data states are programmed. In one embodiment, the higher data states includes S4, S5, S6 and S7, while the lower data states include S1, S2 and S3. In other embodiments, the higher data states and the lower data states can include different groupings of data states. In one embodiment, the multi-pass programming process includes two passes; however, other embodiments can use more than two passes. In some implementations, using two passes can save power. Programming high states first can serve to reduce interference form neighboring memory cells.

Figure 17A:
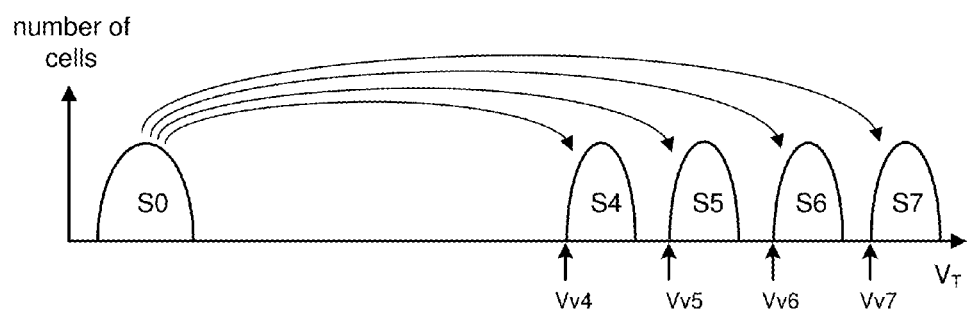
FIG. 17A depicts threshold voltages and programming a first pass of a multi-pass programming process that programs high states first.

FIG. 17A depicts programming a first pass of a multi-pass programming process that programs high states first. During this first pass, memory cells to be programmed from data state S0 to the higher data states S4, S5, S6 and S7 are programmed. The first pass can be implemented using the process of FIG. 10.

Figure 17B:
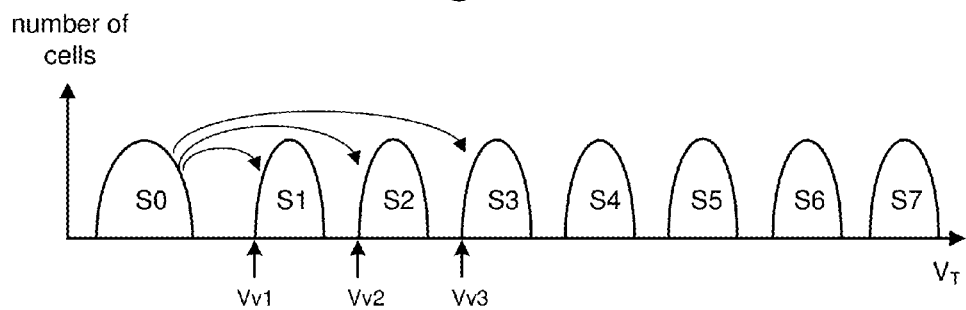
FIG. 17B depicts threshold voltages and programming a second pass of a multi-pass programming process that programs high states first.

FIG. 17B depicts programming a second pass of the multi-pass programming process that programs high states first. During this second pass, memory cells to be programmed from data state S0 to the lower data states S1, S2 and S3 are programmed. The second pass can be implemented using the process of FIG. 10.

FIG. 18 is a table of voltages used during programming and verify for the first pass of the multi-pass programming process that programs high states first. The voltages depicted in FIG. 18 are used to implement the programming of FIG. 17A using the process of FIG. 10.

FIG. 19 is a table of voltages used during programming and verify for the second pass of the multi-pass programming process that programs high states first. The voltages depicted in FIG. 19 are used to implement the programming of FIG. 17B using the process of FIG. 10.

FIGS. 18 and 19 depict the voltages for the source line (SL) of a memory cell selected for programming, the appropriate source side select line of the four possible source side select lines (see 4× SGS), the source side dummy word lines (2× WLDS), the selected word line connected to the memory cells selected for programming (WLN), the unselected word lines (WL0, WL1→N−1 and WLN+1→46, WL47), the drain side dummy word lines (2×WLDD), the appropriate drain side select line of the four possible drain side select lines (see 4× SGD), and the bit line (BL) of a memory cell selected for programming. As discussed above, a word line connects to all memory cells on a same layer of the memory array 126. The source side select lines and the drain side select lines are used to select a subset (e.g., ¼) of memory cells (and NAND strings) within one block. Thus, programming (including verification) is performed on the selected subset (also referred to as a page). The source side select line and the drain side select line associated with the selected subset of memory cells (the source side select line and the drain side select line used to select the selected subset of memory cells) receive the voltages depicted in FIGS. 18 and 19. The source side select lines and the drain side select lines associated with the unselected subsets of memory cells receive 0 volts.

As mentioned above, each bit line is paired with a different source line to form source line/bit line pairs. During certain memory operations, it may be necessary to raise a source line and a bit line of a source line/bit line pair to a common target voltage. In some situations, one of the bit line or the source line might reach that target voltage faster than the other. For example, bit line drivers are positioned under the memory array, while the source line drivers are to the side of the memory array. If the bit line driver is closer to the bit line than the source line driver to the source line, then the bit line might reach the target voltage faster, and vice versa. In some embodiments, the bit lines are Tungsten and source lines are Copper. In general, Copper is a better conductor with lower resistance, so the RC is faster meaning that a source line is likely to charge up faster than a bit line.

When one of a source line or bit line of a source line/bit line pair reaches a common target voltage faster, rather than wait for the other line to reach the target voltage, it is proposed to use a set of one or more memory cells to create an electrical path which effectively shorts the source line to the bit line of a source line/bit line pair so that the line that reaches the target voltage first will pull up the other line faster. This concept is explained graphically by FIG. 20.

Figure 20:
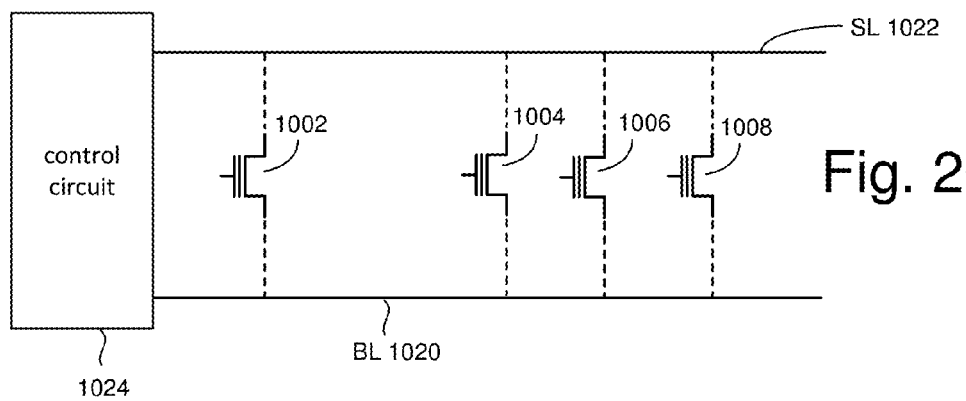
FIG. 20 is a circuit showing multiple memory cells and a control circuit connected to a common source line and a common bit line.

FIG. 20 depicts an example circuit that includes a plurality of non-volatile memory cells 1002, 1004, 1006 and 1008; a first bit line 1020; a first source line 1022; and a control circuit 1024. First source line 1022 and first bit line 1024 are both connected to memory cells 1002, 1004, 1006 and 1008. For example, first source line 1022 is connected to first bit line 1020 by way of memory cell 1022. That is, when memory cell 1022 is on and sufficiently conducting current, first source line 1022 is in communication with first bit line 1020. Control circuit 1024 can be any of the embodiments of control circuits mentioned above and memory cells 1002, 1004, 1006 and 1008 can be part of memory array 126.

Control circuit 1024 is connected to first source line 1022 and first bit line 1024. Control circuit 1024 perform programming for the memory cell, including a programming phase and a verify phase. For example, consider the implementation where memory cell 1002 is used for storing data received from a host and memory cells 1004, 1006 and 1008 are reserved from storing host data (meaning that they will not be used to store host data). Instead, memory cells 1004, 1006 and 1008 are part of a set of one or more NAND chain(s) of memory cells that can selectively create an electrical path which effectively shorts the bit line to the source line of a source line/bit line pair so that the line that reaches the target voltage first will pull up the other line faster. In one embodiment, both bit lines and source lines should be considered to be distributed networks that have different voltages on different pieces of them as the lines are being ramped up or down. By placing these shorting paths at regular spacings along these lines more uniformity of voltages along both lines can be provided at any given instant and the combined bit line/source line pair will reach stability faster when they are supposed to reach the same voltage (for example in setting up for a program pulse). Thus, in this example embodiment, control circuit 1024 is configured to couple the first bit line 1020 to the first source line 1022 during the programming phase for memory cell 1002 by operating the set of the memory cells 1004, 1006 and 1008 to form an electrical path between the first source line and the first bit line. In other embodiments, the set of the memory cells that form an electrical path between the first source line and the first bit line can include more or less than three memory cells.

In the example of FIG. 20, memory cell 1002 is depicted as a single memory cell between first source line 1022 and first bit line 1024. However, dashed lines are used to indicate that memory cell 1002 can be one of many memory cells connected between first source line 1022 and first bit line 1024 in a common NAND string or other structure. Similarly, memory cells 1004, 1006 and 1008 are also depicted with dash lines to indicate that memory cells 1004, 1006 and 1008 can be one of many memory cells connected between first source line 1022 and first bit line 1024 in respective NAND strings or other structures.

Figure 21:
FIG. 21 is a block diagram show a plane of a memory system, with the plane comprising a plurality of blocks of memory cells.

In one set of embodiments, the memory system dedicates one or more blocks of memory cells for selectively shorting the source lines to the bit lines during a memory operation (e.g., during programming). For example, FIG. 21 show example plane 502 of memory array 126 (see FIG. 5) having N blocks. In this example, eight of the blocks (referred to as shorting blocks) are reserved from storing host data and instead are dedicated to selectively shorting source lines to bit lines. The shorting blocks of FIG. 21 include Shorting Block 0, Shorting Block 1, Shorting Block 2, Shorting Block 3, Shorting Block 4, Shorting Block 5, Shorting Block 6, and Shorting Block 7. In one embodiment, the shorting blocks are evenly distributed throughout the plane while in other embodiments the shorting blocks can be positioned anywhere in the plane. Although FIG. 21 shows eight shorting blocks in the plane, other embodiments use more or less than eight shorting block.

In one embodiment of a shorting block, all memory cells of the block are used to short a source line to a bit line. When selected to short, all memory cells of a NAND string are operated in a conductive condition so that the source line is in electrical communication, and effectively shorted, with the bit line. In one embodiment, a shorting block has the same structure as a regular block. All of the memory cells of a shorting block are in the erased state S0. In some embodiments, the select gates (SGS0, SGS1, SGS2, SGS3, SGD0, SGD1, SGD2 and SGD3) are fabricated or programmed to have a low threshold voltage that is greater than zero volts so that they are easy to turn off. In an alternative embodiment, only a portion (e.g., ¼) of a block is used for shorting.

In one embodiment, the shorting blocks selectively short the bit lines to the source lines during programming and do not short the bit lines to the source lines during verifying and reading. For example, the control circuit can be configured to operate the set of the memory cells of the shorting blocks as one or more electrical paths between a particular source line and its associated bit line while concurrently charging the particular source line and its associated bit line to a data dependent target voltage (e.g., see FIGS. 11, 18 and 19) during pre-charging (prior to the program pulse) of the programming phase for one or more memory cells selected for programming.

FIG. 22 is a table that depicts the voltage VSGS for the source side select gates, the voltage VSGD for the selected drain side select gates and the word line voltage WL for a shorting block when operating the shorting block to short the source lines to the bit lines. These voltages make sure that the source side select gates, the drain side select gates and all of the memory cells in the NAND strings are turned on to sufficiently conduct current such that source lines are effectively shorted to the bit lines.

FIG. 23 is a flow chart describing one embodiment of a process for dedicating a set of memory cells (e.g., one or more blocks) to be one or more paths for shorting bit lines to source lines. The process of FIG. 23 can be performed at the time of manufacturing, during device test or in the field during user operation, and can be performed at the direction of controller 122, state machine 112, the host and/or other external device. In step 1102, the system dedicates one or more blocks (including the memory cells in those blocks) to be paths for shorting source lines to bit lines. These are the shorting blocks. In step 1104, the threshold voltages of the memory cells in the shorting blocks are set to be in data state S0. In other embodiments, other threshold voltages can be used. In step 1106, the threshold voltages of the select gates (SGS0, SGS1, SGS2, SGS3, SGD0, SGD1, SGD2 and SGD3) are set to be a low voltage that is greater than zero volts. Note that the process of FIG. 23 can be performed on sets of memory cells other than blocks.

FIG. 24 is a flow chart describing one embodiment of a process for operating shorting blocks (or other groupings of memory cells dedicated to shorting bit lines to source lines). In one embodiment, the process of FIG. 24 is performed by the system of FIG. 1B that includes non-volatile memory cells in a monolithic three dimensional memory structure (ie no intervening substrates), a plurality of source lines connected to the memory cells, a plurality of bit lines connected to the memory cells, a plurality of word lines connected to the memory cells and a control circuit connected to the source lines, the bit lines and the word lines. The control circuit is configured to perform memory operations on a first set of the memory cells (step 1152). For example, the multiple memory cells connected to different bit lines and on different NAND strings of a common block, but connected to a common word line, are programmed. The control circuit is further configured to operate a second set of the memory cells as electrical paths to short the source lines to the bit lines during memory operations for the first set of memory cells (step 1154). For example, as the first set of memory cells in block 1 (see FIG. 21) are being programmed, Shorting Block 0—Shorting Block 1 are used to as electrical paths to short the source lines to the bit lines. The memory cells of the shorting blocks would be connected to the same source lines and bit lines as the memory cells being programmed. However, in one embodiment, the memory cells of the shorting blocks would be connected to different word lines as the memory cells being programmed.

Figure 25:
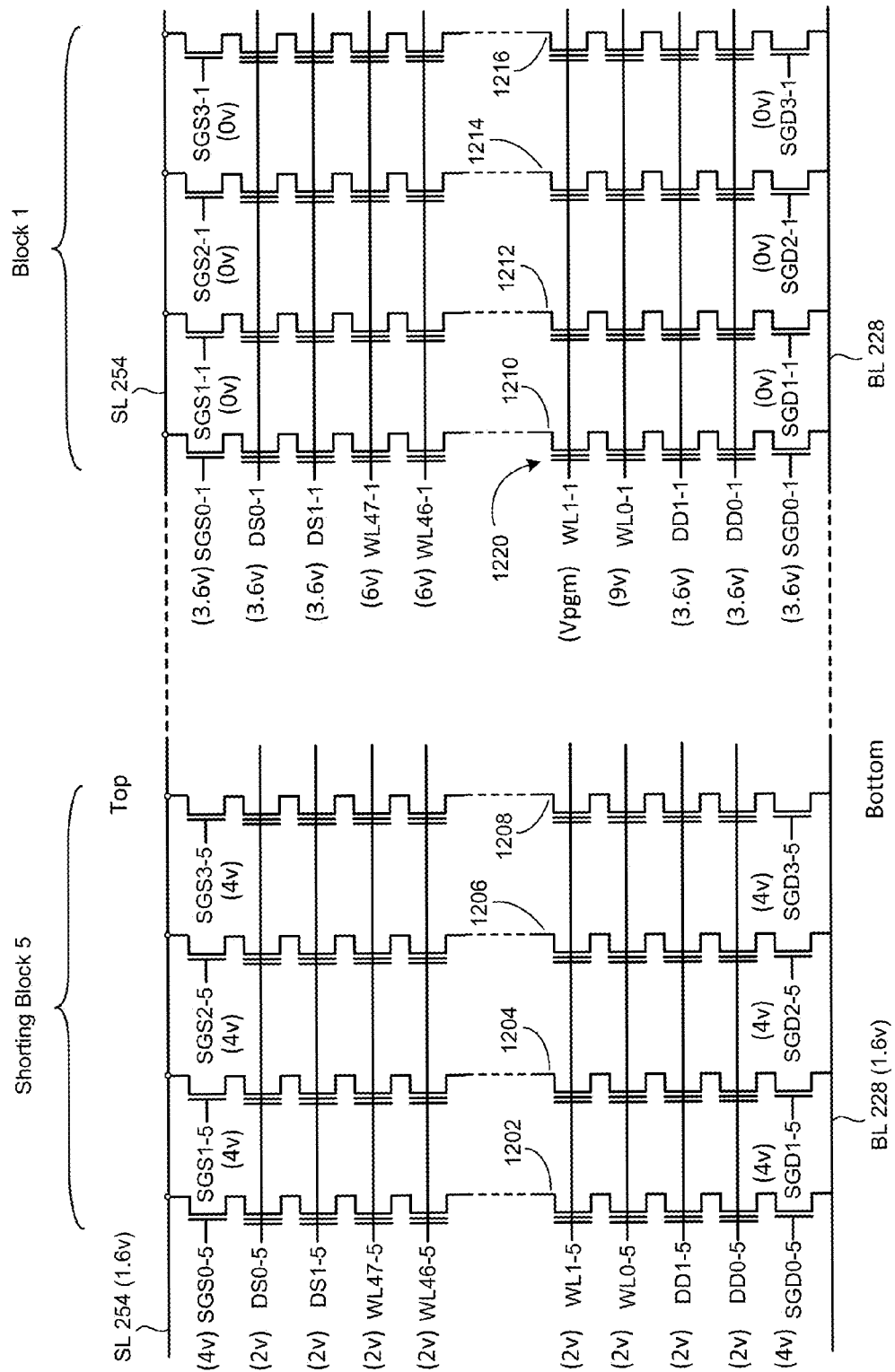
FIG. 25 is a schematic diagram depicting NAND strings from a block dedicated to storing user data and a block dedicated to shorting bit lines to source lines.

FIG. 25 is a schematic diagram depicting NAND strings from block 1 dedicated to storing user data and NAND strings from Shorting Block 5 (see FIG. 21) dedicated to shorting bit lines to source lines, implementing the process of FIG. 24. In general, FIG. 25 depicts non-volatile memory cells in a monolithic three dimensional memory structure, one source line of a plurality of source lines connected to the memory cells, one bit line of a plurality of bit lines connected to the memory cells, and a plurality of word lines connected to the memory cells. A control circuit (as described above) is connected to the source lines, the bit lines and the word lines. The control circuit is configured to perform the process of FIG. 24. More specifically, FIG. 25 shows NAND strings 1202, 1204, 1206 and 1208 of Shorting Block 5, all dedicated to selectively being used as electrical paths to short the source lines to the bit lines. FIG. 25 also shows NAND strings 1210, 1212, 1214 and 1216 of Block 0, all dedicated to storing host data. NAND strings 1202, 1204, 1206, 1208, 1210, 1212, 1214 and 1216 are all connected to bit line 228 and source line 254 (see also FIGS. 2, 3, 6 and 7).

For example purposes, FIG. 25 provides voltage values for a snapshot in time while programming memory cell 1220 of NAND string 1210 to data state S5 during the precharging (just prior to applying a program pulse) of the first pass of multi-pass HSF programming (see FIGS. 17A and 18). Each of the select lines for Shorting Block 5 select gates (SGS0-5, SGS1-5, SGS2-5, SGS3-5, SGD0-5, SGD1-5, SGD2-5 and SGD3-5) receive 4 volts and each of the word lines (DS0-5, DS1-5, DD0-5, DD1-5, WL0-5, WL1-5 . . . WL46-5 and WL47-5) receive 2 volts, such that all of the memory cells and NAND strings of Shorting Block 5 will turn on and sufficiently conduct current to effectively short bit line 228 to source line 254 while bit line 228 and source line 254 are being concurrently charged to 1.6 volts (a data dependent voltage associated with data state S5).

Because the selected memory cell 1220 is in NAND string 1210, which is associated with SGD0-1 and SGS0-1, then SGD0-1 and SGS0-1 are turned on by applying 3.6 volts while SGS1-1, SGS2-1, SGS3-1, SGD1-1, SGD2-1 and SGD3-1 are turned off by applying 0 volts. The selected word line WLn receives Vpgm (ie program pulses), the word lines on the source side of WLn receive 6 volts and the word lines and the drain side of WLn receive 9 volts. Shorting Block 5 is being operated as multiple paths to short source line 254 to bit line 228 while concurrently charging source line 254 and bit lines to data dependent voltage 1.6 volts for S5 during a programming operation for memory cell 1220 (and many other memory cells connected to WLn but not depicted in FIG. 25).

Each of the vertical NAND strings of Shorting Block 5 (or any of the other Shorting Blocks) provide separate electrical paths dedicated to shorting source line/bit line pair and can be selectively connected to and disconnected from the source line/bit line pairs via the select gates (e.g., SGS0-5, SGS1-5, SGS2-5, SGS3-5, SGD0-5, SGD1-5, SGD2-5 and SGD3-5) in response to a control circuit.

The circuit depicted in FIG. 25 is duplicated thousands of times in the memory array for thousands of source line/bit line pairs, each of which are connected to a control circuit as discussed above.

FIG. 26 is a flow chart describing one embodiment of a process for operating blocks of memory cells dedicated to shorting bit lines to source lines during programming. The process of FIG. 26, an example implementation of the process of FIG. 24, can be performed by the circuit of FIG. 25 as well as by other sets of Shorting Blocks and/or other arrangements of memory cells dedicated to short multiple separate and isolated source lines to multiple separate and isolated bit lines. The process of FIG. 26 is performed by the combination of the state machine 112 and controller 122. In other embodiments, other control circuits can implement the process of FIG. 26.

In step 1302 of FIG. 26, the select gates and word lines are charged up to the appropriate voltages for programming. In step 1304, source line/bit line pairs are concurrently charged to common data dependent voltages (one, two or more steps). In step 1306, while concurrently charging up the source line/bit line pairs, the source line is shorted to the bit line for each source line/bit line pair via the vertical NAND strings (memory cells) of the shorting blocks by connecting the vertical NAND strings (memory cells) of the shorting blocks to the source line/bit line pairs. In step 1308, select gate voltages and word line voltages are adjusted to the magnitude to accompany a program pulse. In step 1310, a program pulse is applied (see step 872 of FIG. 10). In step 1312, while applying the program pulse, continue shorting the source line to the bit line for each source line/bit line pair via the vertical NAND strings (memory cells) of the shorting blocks. In step 1314, the system transitions to verify. In step 1316, verification of the programming is performed (see step 876 of FIG. 10). In step 1318, while verifying, the vertical NAND strings (memory cells) of the shorting blocks are disconnected from source line/bit line pairs so there is no shorting source lines to bit lines via the shorting blocks.

The use of shorting blocks (or other groupings of memory cells dedicated for shorting source lines to bit lines) serves to increase the speed of programming.

One embodiment includes an apparatus, comprising: a plurality of non-volatile memory cells; a first bit line connected to a first memory cell; a first source line connected to the first bit line by way of the first memory cell; and a control circuit connected to the first source line and the first bit line. The control circuit is configured to perform a programming process for the first memory cell. The programming process comprises a programming phase and a verify phase. The control circuit is further configured to couple the first bit line to the first source line during the programming phase by operating a set of the memory cells to form an electrical path between the first source line and the first bit line.

One embodiment includes an apparatus, comprising: non-volatile memory cells; source lines connected to the memory cells; bit lines connected to the memory cells; word lines connected to the memory cells; and a control circuit connected to the source lines, the bit lines and the word lines. The control circuit is configured to perform memory operations on a first set of the memory cells. The control circuit is configured to operate a second set of the memory cells as paths to short the source lines to the bit lines through the second set of the memory cells during memory operations for the first set of memory cells.

One embodiment includes performing a programming process for a selected non-volatile memory cell. The programming process comprises charging up a source line and a bit line connected to the selected memory cell during the programming process for the selected memory cell and, while charging up the source line and the bit line during the programming process for the selected memory cell, shorting the source line to the bit line via a set of other memory cells.

One embodiment includes an apparatus, comprising: a plurality of non-volatile memory cells; multiple separate and isolated source lines connected to the memory cells; multiple separate and isolated bit lines connected to the memory cells, each bit line is paired with a different source line to form source line/bit line pairs; and means for shorting the source line/bit line pairs through multiple sets of memory cells dedicated for shorting.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
a plurality of non-volatile memory cells including a first non-volatile memory cell;
a first bit line connected to the first non-volatile memory cell and a set of the non-volatile memory cells;
a first source line connected to the first bit line by way of the first non-volatile memory cell and the set of the non-volatile memory cells; and
a control circuit connected to the first source line and the first bit line, the control circuit configured to perform a programming process for the first non-volatile memory cell, the programming process comprising a programming phase and a verify phase, the control circuit further configured to couple the first bit line to the first source line during the programming phase by operating the set of the non-volatile memory cells to form an electrical path between the first source line and the first bit line, wherein the electrical path is not through the first non-volatile memory cell.

2. The apparatus of claim 1, wherein:
the control circuit is configured to operate the set of the non-volatile memory cells as an electrical path between the first source line and the first bit line while concurrently charging the first source line and the first bit line to a target voltage during the programming phase for the first memory cell.

3. The apparatus of claim 1, further comprising:
additional bit lines; and
additional source lines, each bit line of the additional bit lines is paired with a different source line of the additional source lines to form source line/bit line pairs, the control circuit is connected to the source line/bit line pairs;
wherein for each source line/bit line pair, the control circuit is configured to couple the bit line to the source line during the programming phase by operating additional non-volatile memory cells to form electrical paths between the bit line and the source line of the respective source line/bit line pair while charging different source line/bit line pairs to different target voltages.

4. The apparatus of claim 1, wherein:
the programming process for the first memory cell includes programming multiple non-volatile memory cells;
the control circuit further configured to couple the first bit line to the first source line during the programming phase by operating the set of the non-volatile memory cells to form multiple electrical paths between the first source line and the first bit line;
the first non-volatile memory cell and the multiple non-volatile memory cells are connected to a common word line and different bit lines; and
all of the non-volatile memory cells of the set of memory cells are all connected to the first bit line and the first source line.

5. The apparatus of claim 1, wherein:
the first non-volatile memory cell can be programmed from an erased state to any of a set of programmed states; and
the set of non-volatile memory cells has memory cells with threshold voltages within the erased state.

6. The apparatus of claim 1, wherein:
the first memory cell is in a first block;
the set of non-volatile memory cells comprise blocks dedicated to shorting source lines to bit lines; and
the control circuit configured to reserve the set of memory cells from storing host data.

7. An apparatus, comprising:
non-volatile memory cells;
multiple source lines connected to the non-volatile memory cells and configured to drive different independent voltages;
bit lines connected to the non-volatile memory cells;
word lines connected to the non-volatile memory cells; and
a control circuit connected to the source lines, the bit lines and the word lines, the control circuit configured to perform memory operations on a first set of the non-volatile memory cells, the control circuit configured to operate a second set of the non-volatile memory cells as paths to short the source lines to the bit lines through the second set of the non-volatile memory cells during memory programming operations for the first set of the non-volatile memory cells, wherein the second set does not include a non-volatile memory cell of the first set.

8. The apparatus of claim 7, wherein:
the control circuit is configured to operate the second set of the non-volatile memory cells as paths to short the source lines to the bit lines while concurrently charging source lines and bit lines to data dependent voltages during the programming operations for the first set of non-volatile memory cells.

9. The apparatus of claim 7, wherein:
each bit line is paired with a different source line to form source line/bit line pairs;
the second set of non-volatile memory cells includes a first subset of memory cells that are dedicated to shorting a first source line/bit line pair and can be selectively connected to and disconnected from the first source line/bit line pair; and
the second set of non-volatile memory cells includes a second subset of memory cells that are dedicated to shorting a second source line/bit line pair and can be selectively connected to and disconnected from the second source line/bit line pair.

10. The apparatus of claim 9, wherein:
the control circuit is configured to connect the first subset of memory cells to the first source line/bit line pair to short the first source line/bit line pair while concurrently charging the first source line/bit line pair during the programming operations for the first set of non-volatile memory cells; and the control circuit is configured to disconnect the first subset of memory cells from the first source line/bit line pair during verify operations for the first set of non-volatile memory cells.

11. The apparatus of claim 9, further comprising:
a first group of select gates connected to the first subset of memory cells for connecting and disconnecting the first subset of memory cells to and from the first source line/bit line pair; and
a second group of select gates connected to the second subset of memory cells for connecting and disconnecting the second subset of memory cells to and from the second source line/bit line pair, the first group of select gates and the second group of select gates have threshold voltages greater than 0 volts.

12. The apparatus of claim 7, further comprising:
bit line drivers connected to the bit lines; and
source line drivers connected to the source lines;
wherein each bit line is paired with a different source line to form source line/bit line pairs, the non-volatile memory cells are part of a monolithic three dimensional memory structure, the source lines are positioned above the monolithic three dimensional memory structure, the source line drivers are positioned on one or more sides of the monolithic three dimensional memory structure, the bit lines and the bit line drivers are positioned below the monolithic three dimensional memory structure.

13. The apparatus of claim 7, wherein:
the first set of non-volatile memory cells is in a first set of blocks; and
the second set of non-volatile memory cells comprises blocks dedicated to shorting source lines to bit lines.

14. The apparatus of claim 7, wherein:
the first set of non-volatile memory cells is in a first set of vertical NAND strings;
the second set of non-volatile memory cells comprises a second set of vertical NAND strings;
the control circuit is configured to operate the second set of vertical NAND strings as paths to short source lines to bit lines during memory operations for the first set of vertical NAND strings;
the memory cells of the first set are connected to a common word line and different bit lines; and
the memory cells of the second set are connected to a common bit line and a common source line.

15. A method, comprising:
performing a programming process for a selected non-volatile memory cell including:
charging up a source line and a bit line connected to the selected non-volatile memory cell during the programming process for the selected non-volatile memory cell; and
while charging up the source line and the bit line during the programming process for the selected non-volatile memory cell, shorting the source line to the bit line via a set of other memory cells, wherein the shorting includes an electrical path that is not though the selected non-volatile memory cell.

16. The method of claim 15, further comprising:
dedicating the set of other memory cells to be the electrical path for shorting, the shorting the source line to the bit line includes connecting the memory cells of the set of other memory cells to the source line and the bit line via multiple select gates.

17. The method of claim 15, wherein:
the source line and the bit line are charged to a common data dependent voltage based on a programming target for the selected non-volatile memory cell.

18. The method of claim 15, wherein:
the selected non-volatile memory cell is in a selected vertical NAND sting;
the set of other memory cells comprise multiple vertical NAND strings in multiple blocks in a same plane as the selected non-volatile memory cell; and
the shorting the source line to the bit line includes the shorting of the source line to the bit line via the multiple vertical NAND strings in the multiple blocks.

19. The method of claim 15, wherein the shorting of the source line to the bit line comprises:
applying voltages to the set of other memory cells that turn on memory cells of the set of other memory cells; and
connecting memory cells of the set of other memory cells, including memory cells that have been turned on due to said applying of voltages, to the source line and the bit line via multiple select gates.

20. An apparatus, comprising:
a plurality of non-volatile memory cells;
multiple separate and isolated source lines connected to the memory cells;
multiple separate and isolated bit lines connected to the memory cells, each bit line is paired with a different source line to form source line/bit line pairs; and
means for shorting, while programming a first non-volatile memory cell of the plurality of non-volatile memory cells, a source line connected to the first non-volatile memory cell to a bit line connected to the first non-volatile memory cell within at least one of the source line/bit line pairs through multiple sets of the non-volatile memory cells that are dedicated for shorting.

* * * * *

UNITED STATES PATENT AND TRADEMARK OFFICE
CERTIFICATE OF CORRECTION

PATENT NO. : 9,911,488 B2
APPLICATION NO. : 15/299372
DATED : March 6, 2018
INVENTOR(S) : Mokhlesi Page 1 of 1

It is certified that error appears in the above-identified patent and that said Letters Patent is hereby corrected as shown below:

In the Claims

Column 28, Line 5 (Claim 15, Line 12) please change "not though" to -- not through --

Signed and Sealed this
Fourteenth Day of August, 2018

Andrei Iancu
*Director of the United States Patent and Trademark Office*